(12) United States Patent
Flunkert et al.

(10) Patent No.: US 10,936,947 B1
(45) Date of Patent: Mar. 2, 2021

(54) RECURRENT NEURAL NETWORK-BASED ARTIFICIAL INTELLIGENCE SYSTEM FOR TIME SERIES PREDICTIONS

(71) Applicant: Amazon Technologies, Inc., Seattle, WA (US)

(72) Inventors: Valentin Flunkert, Berlin (DE); David Jean Bernard Alfred Salinas, Berlin (DE)

(73) Assignee: Amazon Technologies, Inc., Seattle, WA (US)

( * ) Notice: Subject to any disclaimer, the term of this patent is extended or adjusted under 35 U.S.C. 154(b) by 806 days.

(21) Appl. No.: 15/417,070

(22) Filed: Jan. 26, 2017

(51) Int. Cl.
*G06N 3/08* (2006.01)
*G06F 17/18* (2006.01)
*G06N 3/04* (2006.01)
*G06F 30/20* (2020.01)

(52) U.S. Cl.
CPC .............. *G06N 3/08* (2013.01); *G06F 17/18* (2013.01); *G06F 30/20* (2020.01); *G06N 3/0445* (2013.01)

(58) Field of Classification Search
CPC ........ G06N 3/08; G06N 3/0445; G06F 17/18; G06F 17/5009
See application file for complete search history.

(56) References Cited

U.S. PATENT DOCUMENTS

2014/0108094 A1* 4/2014 Beddo ................. G06Q 10/067
705/7.31

FOREIGN PATENT DOCUMENTS

WO  WO-2015060866 A1 *  4/2015  ......... G06Q 30/0202

OTHER PUBLICATIONS

U.S. Appl. No. 14/662,021, filed Mar. 18, 2015, Gregory Michael Duncan, et al.
U.S. Appl. No. 15/153,713, filed May 12, 2016, Matthas Seeger, et al.
Texts: Online, Open-Access Textbooks, "7.1 Simple exponential smoothing," Rob J. Hyndman and George Athanasopoulos, downloaded from https://www.otexts.org/fpp/7/1 on Mar. 14, 2016, pp. 1-11.
Amazon webservices, "Amazon Machine Learning," Developer Guide, Latest Version, API Version Apr. 9, 2015, Last documentation update Mar. 21, 2016, pp. 1-143.
Benglo, et al., Google Research, Scheduled Sampling for Sequence Prediction with Recurrent Neural Networks, Sep. 23, 2015, pp. 1-9.
Sutskever, et al. "Sequence to Sequence Learning with Neural Networks," Submitted on Sep. 10, 2014 (v1), last revised Dec. 14, 2014 (this version, v3), pp. 1-9.

(Continued)

*Primary Examiner* — Austin Hicks
(74) *Attorney, Agent, or Firm* — Robert C. Kowert; Kowert, Hood, Munyon, Rankin & Goetzel, P.C.

(57) ABSTRACT

At a network-accessible artificial intelligence service for time series predictions, a recurrent neural network model is trained using a plurality of time series of demand observations to generate demand forecasts for various items. A probabilistic demand forecast is generated for a target item using multiple executions of the trained model. Within the training set used for the model, the count of demand observations of the target item may differ from the count of demand observations of other items. A representation of the probabilistic demand forecast may be provided via a programmatic interface.

24 Claims, 12 Drawing Sheets

(56) References Cited

OTHER PUBLICATIONS

Ahmed, Nesreen K., et al., Publisher Taylor & Francis, "An Empirical Comparison of Machine Learning Models for Time Series Forecasting," Sep. 15, 2010, pp. 1-29.
Qingzheng xu, "A Review of Croston's method for intermittent demand forecasting," Jan. 1012, IEEE, pp. 468-472.
Nicolas Chapados, "Effective Bayesian Modeling of Groups of Related Count Time Series," Proceedings of the 31st International Conference on Machine Learning, Beijing, China, 2014. JMLR: W&CP vol. 32. Copyright 2014 by the author(s), pp. 1-9.
Research Program on Forecasting, "Forecasting the Intermittent Demand for Slow-Moving Items," Snyder, at al., Original Working Paper: May 18, 2010; Revised: Mar. 11, 2011, pp. 1-39. RPF Working Paper No. 2010-003, http://www.gwu.edu/~forcpgm/2010-003.pdf.
Christopher M. Bishop, Pattern Recognition and Machine Learning, 2002-2006, Springer 2006, First printing, pp. 1-82, More Info at http://research.microsoft.com/~cmbishop/PRML.
U.S. Appl. No. 15/458,645, filed Mar. 14, 2017, Andrew Christopher Chud.
U.S. Appl. No. 15/441,896, filed Feb. 24, 2017, Jan Alexander Gasthaus et al.
Xiangrui Meng, et al., "MLlib: Machine Learning in Apache Spark", Journal of Machine Learning Research 17, 2016, pp. 1-7.
Martin Jaggi, et al., "Communication-Efficient Distributed Dual Coordinate Ascent", Retrieved from URL: http://arxiv.org/abs/1409.1458v2, pp. 1-15.
Alexander Alexandrov, et al., "The Stratosphere platform for big data analytics", The VLDB Journal, Published online May 6, 2014, Springer, pp. 1-26.
Mikhail Bilenko, et al., "Towards Production-Grade, Platform-Independent Distributed ML", Proceedings of the 33rd International Conference on Machine Learning, 2016, pp. 1-5.
Matthias Seeger, et al., "Bayesian Intermittent Demand Forecasting for Large Inventories", 30th Conference on Neural Information Processing Systems (NIPS 2016), 2016, pp. 1-9.
Ronnie Chaiken, et al., "Scope: Easy and Efficient Parallel Processing of Massive Data Sets", PVLDB '08, Aug. 23-28, 2008, ACM, pp. 1265-1276.
Yossi Arjevani, et al., "Communication Complexity of Distributed Convex Learning and Optimization", Retrieved from URL: http://arxiv.org/abs/1506.01900v2, pp. 1-27Tim Kraska, et al., "MLbase: A Distributed Machine-learning System", CIDR 2013, 6th Biennial Conference on Innovative Data Systems Research, pp. 1-7.
Abhay Jha, et al., "Clustering to Forecast Sparse Time-Series Data", 2015 IEEE 31st International Conference, 2015, pp. 1388-1399.
"ISF 2014 Economic Forecasting—Past, Present and Future", Foresight Fall 2013, Issue 31, The International Journal of Applied Forecasting, 2013, pp. 1-56.
Vinayak Borkar, et al., "Hyracks: A Flexible and Extensible Foundation for Data-Intensive Computing", Data Engineering (ICDE), 2011 IEEE 27th International Conference, pp. 1151-1162.
"KeystoneML", Retrieved from URL: http://keystoneml.org/index.html on Jan. 10, 2017, pp. 1-4.
Arun Kumar, et al., "Model Selection Management Systems: The Next Frontier of Advanced Analytics", ACM SIGMOD, Record 44.4, 2016, pp. 17-22.
Jimmy Lin, et al., "Large-Scale Machine Learning at Twitter", SIGMOD '12, May 20-24, 2012, pp. 793-804.
Amazon Web Services, "Amazon Machine Learning Developer Guide Version Latest", Updated Aug. 2, 2016, pp. 1-146.
Ce Zhang, et al., "Materlialization Optimizations for Feature Selection Workloads", SIGMOD '14, Jun. 22-27, 2014, pp. 1-12.
Cheng-Tao Chu, et al., "Map-Reduce for Machine Learning on Multicore", In Advances in Neural Information Processing Systems, 2007, pp. 281-288.
Matei Zaharia, et al., "Resilient Distributed Datasets a Fault-Tolerant Abstraction for In-Memory Cluster Computing", amplab UC Berkeley, 2012, pp. 1-30.
Matei Zaharia, et al., "Resilient Distributed Datasets a Fault-Tolerant Abstraction for In-Memory Cluster Computing", Proceedings of the 9th USENIX Conference on Networked Systems Design and Implementation, pp. 1-30.
Matthias Boehm, et al., "Hybrid Parallelization Strategies for Large-Scale Machine Learning in SystemML", Proceeding of the VLDB Endowment, vol. 7, No. 7, 40th International Conference on Very Large Data Bases, Sep. 1-5, 2014, pp. 553-564.
Yucheng Low, et al., "Distributed GraphLab: A Framework for Machine Learning and Data Mining in the Cloud", The 38th International Conference on Very Large Data Bases, Aug. 27-31, 2012, pp. 716-727.
Fabian Pedregosa, et al., "Scikit-learn" Machine Learning in Python, Journal of Machine Learning Research 12, 2011, pp. 2825-2830.
D. Sculley, et al., "Hidden Technical Debt in Machine Learning Systems", In Advances in Neural Information processing Systems, 2015, pp. 2503-2511.
Michael Armbrust, et al., "Spark SQL: Relational Data Processing in Spark", ACM, SIGMOD '15, May 31-Jun. 4, 2015, pp. 1-12.
Amol Ghoting, et al., "SystemML: Declarative Machine Learning on MapReduce", In Data Engineering (ICDE), 2011 IEEE 27th International Conference on, pp. 231-242.

\* cited by examiner

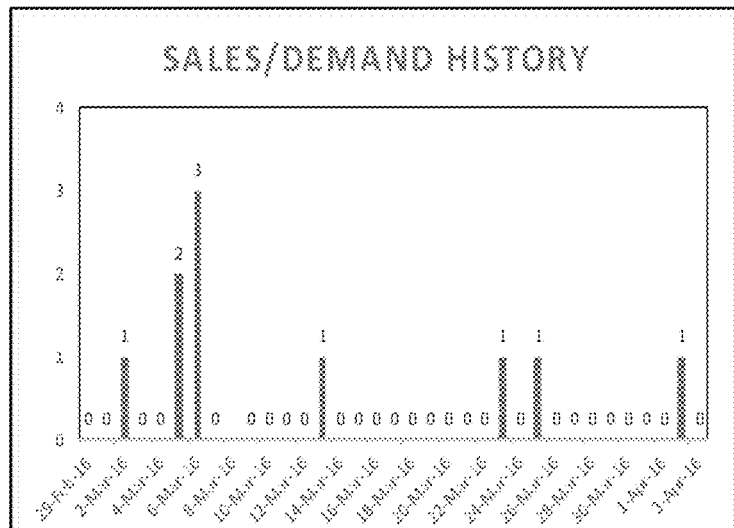

| Date | Sales |
|---|---|
| ... | ... |
| 29-Feb-16 | 0 |
| 1-Mar-16 | 0 |
| 2-Mar-16 | 1 |
| 3-Mar-16 | 0 |
| 4-Mar-16 | 0 |
| 5-Mar-16 | 2 |
| 6-Mar-16 | 3 |
| 7-Mar-16 | 0 |
| 7-Mar-16 | 0 |
| 9-Mar-16 | 0 |
| 10-Mar-16 | 0 |
| 11-Mar-16 | 0 |
| 12-Mar-16 | 0 |
| 13-Mar-16 | 1 |
| 14-Mar-16 | 0 |
| 15-Mar-16 | 0 |
| 16-Mar-16 | 0 |
| 17-Mar-16 | 0 |
| 18-Mar-16 | 0 |
| 19-Mar-16 | 0 |
| 20-Mar-16 | 0 |
| 21-Mar-16 | 0 |
| 22-Mar-16 | 0 |
| 23-Mar-16 | 1 |
| 24-Mar-16 | 0 |
| 25-Mar-16 | 1 |
| 26-Mar-16 | 0 |
| 27-Mar-16 | 0 |
| 28-Mar-16 | 0 |
| 29-Mar-16 | 0 |
| 30-Mar-16 | 0 |
| 31-Mar-16 | 0 |
| 1-Apr-16 | 0 |
| 2-Apr-16 | 1 |
| 3-Apr-16 | 0 |

Price reduction period 820

Out-of-stock interval 822

Per-day sales time series 802
(for low-demand item I1)

Sales graph 823 (item I1)

Forecasting request examples  860

Approximately how many I1s will be sold between May 1 – May 15?

Will any I1s be sold on April 15 if a 10% discount is applied?

What is the probability of selling three or more I1s on any single day in April or May?

Forecaster 850

RECURRENT NEURAL NETWORK-BASED ARTIFICIAL INTELLIGENCE SYSTEM FOR TIME SERIES PREDICTIONS

BACKGROUND

For many kinds of business and scientific applications, the ability to generate accurate forecasts of future values of various measures (e.g., retail sales, or demands for various types of goods and products) based on previously collected data is a critical requirement. The previously collected data often consists of a sequence of observations called a "time series" or a "time series data set" obtained at respective points in time, with values of the same collection of one or more variables obtained for each point in time (such as the per-day sales for a particular inventory item over a number of months, which may be recorded at an Internet-based retailer). Time series data sets are used in a variety of application domains, including for example weather forecasting, finance, econometrics, medicine, control engineering, astronomy and the like.

The statistical properties of some time series data, such as the demand data for products or items that may not necessarily be sold very frequently, can make it harder to generate forecasts. For example, an Internet-based footwear retailer may sell hundreds of different shoes, and for most days in a given time interval, there may be zero (or very few) sales of a particular type of shoe. Relatively few winter shoes may be sold for much of the summer months of a given year in this example scenario. On the other hand, when sales of such infrequently-sold items do pick up, they may be bursty—e.g., a lot of winter shoes may be sold in advance of, or during, a winter storm. The demand for some items may also be correlated with price reductions, holiday periods and other factors. Some traditional prediction approaches, when confronted with time series which consist largely of zero demand values, may be unable to predict non-zero demands with desired accuracy levels, especially for the large lead times which may sometimes be required to replenish the supplies of the items.

Some organizations may be responsible for stocking and selling very large inventories, where the statistical properties of the demands for individual items within the inventory may vary, with some items selling much more slowly and with a greater degree of intermittency than others. In today's competitive environment, such organizations may be under substantial pressure to ensure that the supplies they maintain of various items are generally sufficient to meet customer needs. Sustained out-of-stock situations may, for example, lead to poor customer satisfaction and consequently to loss of customers. At the same time, the organizations also cannot afford to maintain excessive stocks of infrequently-purchased items—some of the organizations may for example sell millions of items, and the costs of overstocking all the items may quickly become unsustainable. In some cases, there may not be enough space in warehouses or fulfillment centers for storing items that do not sell as much as anticipated. with Forecasting demand accurately for items with a variety of demand behavior characteristics in a timely and efficient manner may present a non-trivial challenge.

BRIEF DESCRIPTION OF DRAWINGS

FIG. 8 illustrates an example of a demand data set for an item, and examples of forecast-related queries for the item, according to at least some embodiments.

Figure 1:
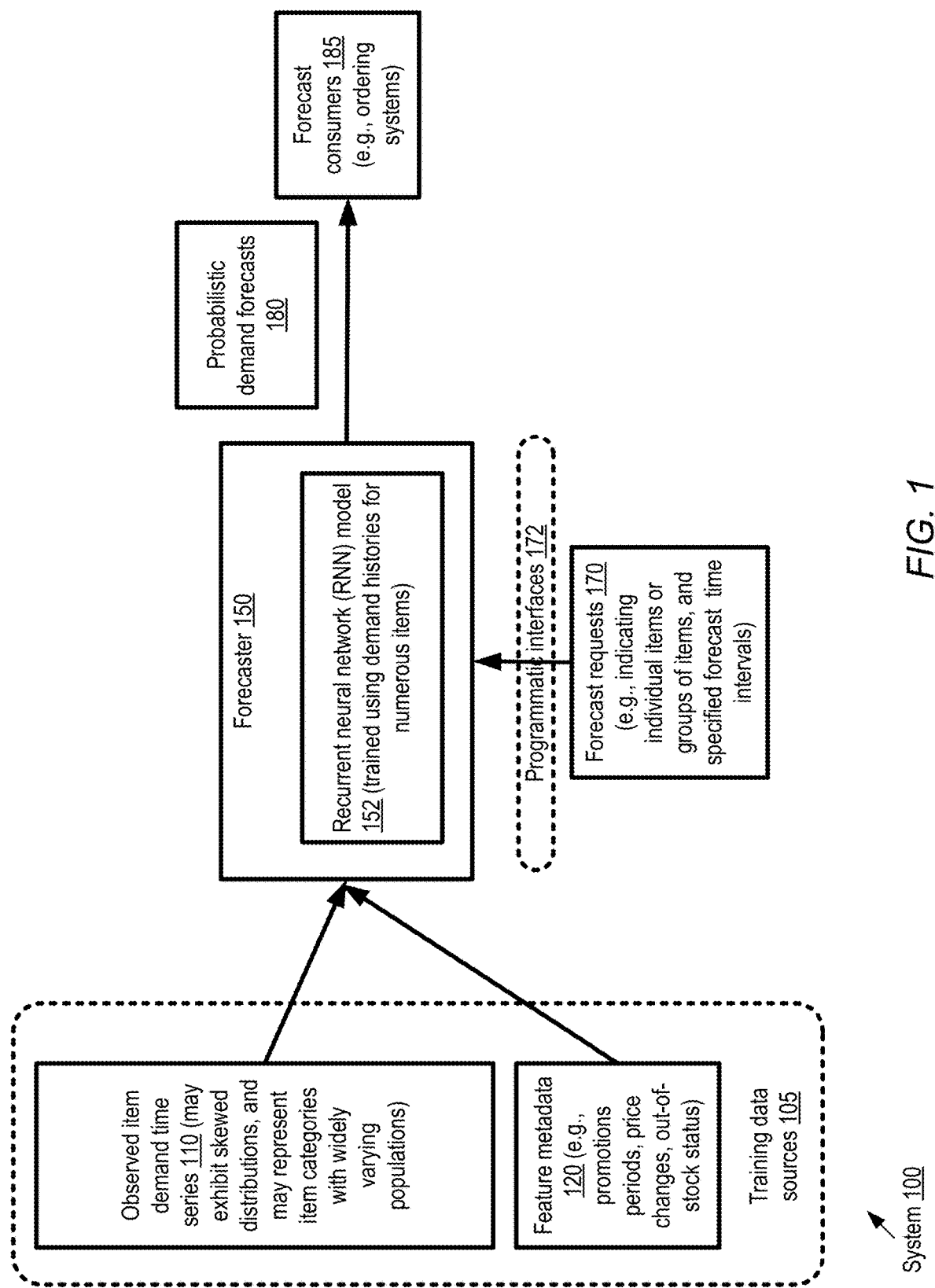
FIG. 1 illustrates an example artificial intelligence system in which time series predictions may be generated using a recurrent neural network model, according to at least some embodiments.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to. When used in the claims, the term "or" is used as an inclusive or and not as an exclusive or. For example, the phrase "at least one of x, y, or z" means any one of x, y, and z, as well as any combination thereof.

DETAILED DESCRIPTION

Various embodiments of methods and apparatus for demand forecasting using recurrent neural network models are described. In at least some embodiments, one or more recurrent neural networks (RNNs) may be employed to generate demand predictions using a plurality of demand observation time series as a training data set. For example, in one embodiment an encoder RNN may be used to transform known information about various items, such as observed demand values over some time periods for each individual item, as well as data regarding item characteristics such as category identifiers (indicating different product categories, e.g., "shoes" versus "jackets"), price, item introduction time or age, promotions, discounts, out-of-stock periods, and so on, into intermediary feature vectors used as input by a second RNN referred to as a decoder RNN. Additional features which are not generated by the decoder may also be supplied as input to the decoder RNN in at least some embodiments. Within the decoder RNN, in at least some embodiments samples from a probabilistic demand forecast distribution obtained as output for one time step may be used as inputs for the next time step.

In various embodiments, a large number (e.g., millions) of time series representing observed demands for respective items of a large inventory for relatively long time periods may be used to train the RNN model. In some cases, several years of weekly or daily demand may be used for training the RNN model, and as a result the model may be able to incorporate seasonal variations in demand automatically. For example, if demand for a particular category of item (e.g., a "luxury gift" product category) varies with the number of days until a particular holiday which occurs once a year and on different dates in different years, the use of multiple years' worth of training data may enable the model to learn about such seasonal changes in demand based on time relative to the occurrence date of the holiday, regardless of the actual date on which the holiday occurs in a given prediction time period. When the trained model is used for prediction, in at least some embodiments a future date on which the holiday is to occur (which may be part of the requested forecast period in some cases) may be provided as part of the input to the model, and the timing of the future occurrence may be used to generate demand predictions based on the seasonal impact of the holiday which was learned by the model during training.

After the RNN model is trained, in at least some embodiments it may be executed repeatedly to obtain a probabilistic distribution of predictions for any desired time range, with each execution providing a vector of point demand predictions over an indicated time range. In at least some embodiments, a log likelihood measure may be used as the loss metric during training of the RNN model.

In at least one embodiment, if a sufficiently large training data set is used, the model may be general enough to be able to make predictions regarding demands for an item for which no (or very few) demand observations were available for training. For example, if information regarding the similarity of a new item $I_{new}$ to some set of other items $\{I_{old}\}$ along one or more dimensions such as item/product category, price, etc. is provided, where demand observations for $\{I_{old}\}$ items were used to train the model while demand observations for $I_{new}$ was not used to train the model, the model may still be able to provide useful predictions for $I_{new}$ demand in such an embodiment. The accuracy of the forecasts may increase with the amount of information available about the items being considered in at least some embodiments—e.g., if several weeks of actual demand observations for an item $I_j$ are used to train the model, and several months or years of demand observations for another item $I_k$ are used to train the model, the forecasts for $I_k$ may tend to be more accurate than the forecasts for $I_j$. The number of actual demand observations for different items which are used as part of the training set of the model may differ in at least some embodiments (for example, the missing data points may be replaced by zero demand data points in some implementations). In at least one embodiment in which information about the similarity between a particular target item $I_a$ (for which demand is to be forecast) and another item $I_b$ (whose demand observations were used for training) is provided as input to the RNN model, the number of actual demand observations available for $I_b$ may exceed the number of demand observations available for $I_a$. That is, accurate forecasts for $I_a$ may be generated using the RNN model in such an embodiment based on the larger count of demand observations of $I_b$ and the similarity of $I_b$ and $I_a$, despite the smaller count of available observations of $I_a$ demand.

In various embodiments, the distribution of demand (e.g., as indicated by the number of items sold per day on days that the items are not out of stock) over time for one subset of items of an inventory may differ substantially from the distribution of demand over the same time interval for other subsets of the inventory items. For example, some items may exhibit very low and/or intermittent demand, with zero sales on most days and less than ten items sold on most days with non-zero demand; other items may have much higher overall demand and few days with zero sales. This phenomenon may be referred to as skewed distribution of demand; the extent of the skew may vary significantly from one data set to another. In order for a single unified RNN model to be able to make predictions with roughly similar levels of accuracy for all the items, compensatory operations may be performed during training in some embodiments, in which the different portions of training data may be treated differently in response to the skew in the demand distributions. It is noted that at least in some embodiments, a data set may not actually have to be divided into skew-based subsets, and the forecasting system or service may not necessarily define the boundaries between distinct subsets, or assign individual items to respective subsets. Instead, for example, the compensatory operations may be performed dynamically in such embodiments, as and when new time series are examined. A number of different compensatory approaches may be taken in various embodiments as discussed below in further detail—e.g., a demand time series for an item which shows an unusual demand distribution may be used to generate multiple training input examples by using different starting points for each example within the time series, demand time series for more common distributions may be sub-sampled during training, different training weights may be applied to the items exhibiting different demand behaviors, or the input and/or outputs of the RNN model may be re-scaled or normalized to compensate for the different demand distributions.

The RNN-based forecasting technique may be implemented at one or more computing devices which may be collectively referred to herein as a forecaster in some embodiments. Such a forecaster may, in one embodiment, be incorporated within a network-accessible forecasting service or a more general machine learning service. In other embodiments, the forecaster may be implemented in a standalone mode and may not necessarily be associated with or part of a network-accessible service. The RNN-based algorithms outlined herein may be utilized for efficiently generating forecasts for an inventory with hundreds of thousands (or even millions) of items in various embodiments.

In addition to the demand values themselves, the forecaster may also obtain various other types of other metadata associated with the items being used for the training set and/or associated with the items for which forecasts are to be generated—e.g., information about special events or holidays which may have affected the demand for an item, the timing of price changes with respect to the item or items, information about time periods during which a given item was out of stock, etc., may be made available to the forecaster. Generally speaking, feature metadata may comprise elements of information that could potentially help explain the variation in demand over time for the item or items being considered, and it may therefore be useful to incorporate the feature metadata into the predictive models used for forecasting.

The results provided by the forecaster may be used to make various types of business decisions more intelligently in various embodiments—e.g., to generate purchase orders for appropriate quantities of items at appropriate times, to decide whether it is worthwhile to continue stocking various items or not, to plan ahead for warehouse space expansions, and so on. In at least some embodiments, the forecasts may be provided as input to an automated ordering system, which may in turn transmit orders for various inventory items to meet business requirements of the organization on behalf of which the forecasts were produced. In some embodiments, the output of the algorithm may be provided to other automated forecast-consuming entities or systems, such as a discount planning system, a facilities planning system, a promotions planning system or a product placement planning system. Using the demand predictions of the algorithm, the discount management system may, for example, make recommendations or decisions regarding if, when, for how long and by how much the price of a particular inventory item should be reduced. A facilities planning system may use the forecasts for managing warehouse space for various products. A promotions planning system may be able to recommend specific tie-ins with external factors (such as a sale of a particular set of items associated with a release of a motion picture or the staging of a sports event) using the forecasts. A product placement planning system may utilize the forecasts for helping recommend the shelf locations of various items in a physical store, or whether an item should be placed in a shopfront window, for example. In some embodiments, the forecasts may be used to anticipate side effects of future demands, such as increases or decreases in shipping costs, which may influence business contracts with mailing/delivery services and so on.

In one embodiment, the customers or clients on whose behalf the forecasting is being performed may indicate preferences regarding the metrics to be used to rate the quality of the forecasts. For example, one client may programmatically indicate that the accuracy of the median (50th percentile) forecast for T days in the future is of greatest interest, while for another client, the accuracy of the $90^{th}$ percentile forecast for 2*T days of the future may be more important. Based on the input provided programmatically by the clients, the forecaster may evaluate the RNN-based model. If the evaluations indicate that the model does not meet a desired quality/accuracy criterion, the model may be adjusted in some embodiments—e.g., various hyperparameters, initial parameters and/or feature extraction techniques may be modified and the model may be retrained. In at least one embodiment, new versions of the models may be generated over time as new demand observations are obtained. For example, in one implementation, new demand forecasts for K weeks into the future may be generated every week using demand data collected over a time window of the previous N weeks as input for the composite modeling methodology.

It is noted that although, in much of the remainder of this document, item demand data sets are used as the examples of data for which forecasts are generated using the RNN modeling methodology, the techniques may be used for any types of time series data sets which exhibit similar characteristics. That is, at least in some embodiments, the RNN-based modeling methodology need not necessarily be restricted to predicting future demands for goods or items, but may be employed for predictions with respect to time series data sets that represent other types of observed phenomena, such as the utilization levels of various resources in a computing environment, the occurrences of certain types of medical events such as disease diagnoses, crime events and so on.

Example System Environment

FIG. 1 illustrates an example artificial intelligence system in which time series predictions may be generated using a recurrent neural network model, according to at least some embodiments. As shown, system 100 may comprise three broad categories of components: training data sources 105, a forecaster 150 and one or more forecast consumers 185 on whose behalf forecast requests 170 may be submitted to the forecaster. Generally speaking, the forecaster 150 may comprise one or more computing devices collectively configured to implement a set of forecasting algorithms and models in various embodiments.

In the depicted embodiment, training data sources 105 may include at least one source from which observed item demand time series 110 for some set of items may be obtained, and one source from which feature metadata 120 may be obtained. For example, if the forecasting system 100 is being used by a large-scale online retailer, the time series 110 may correspond to recorded purchases at one or more web sites of the retailer. The feature metadata 120 may itself be collected from a plurality of entities—e.g., information regarding price changes or sale periods may be obtained from a pricing database and/or a marketing/promotions database, out-of-stock information may be obtained from an inventory database, holiday-related information may be obtained from geographic-region-specific calendars, and so on. In some embodiments, the demand time series and/or the feature-related information may be provided periodically in the form of batch updates (e.g., once a week or once every three days) to the forecaster 150, e.g., via a set of programmatic interfaces exposed by the forecaster. In other embodiments, fresh demand information and/or fresh feature metadata may be provided to the forecaster as soon as it becomes available, and the forecaster 150 may be responsible for discretizing or batching the data to make its predictions.

The observed demand time series 110 may exhibit skewed demand behavior in at least some embodiments. That is, different groups of items, or individual items represented in the time series 110 may have demand distributions that are statistically distinct from one another in the depicted embodiment. The term "velocity" may be used in at least some embodiments to distinguish among demand distributions over time of different items of an inventory. For example, items which sell in high quantities (e.g., an average of hundreds of items per day in a given geographical region) may be designated as high demand-velocity items, while items which sell in relatively low quantities (e.g., with a large number of zero demand days, and an average demand of no more than ten items on days with non-zero demand) may be designated as low demand-velocity items. In at least some embodiments, individual items may be designated or labeled as belonging to one of several product categories (such as jewelry, shoes, household goods and the like in the case of a retailing environment), and the populations of different product/item categories may also be skewed, with some categories having far fewer items than others. Other characteristics of the individual items, such as prices, may also exhibit skewed distributions. In at least some embodiments, one or more properties of the items of the observed demand time series 110 may exhibit the type of scale invariance and distribution behavior which corresponds to the "power law" relationship. In the depicted embodiment, the forecaster 150 may determine differences, with respect to one or more distribution metrics such as mean demand, most common demand, range between minimum and maximum demand, or day-to-day variation, between various observations or time series. Such differences may be detected or identified dynamically, e.g., as the individual time series are examined in at least some embodiments, and may not require pre-processing of the data set as a whole. The extent of the skew in item characteristics may differ substantially in some embodiments; e.g., depending on the kinds of items represented in the training data set, there may be millions of low demand-velocity items with corresponding time series and only a few thousand high demand-velocity items with corresponding time series. In at least one embodiment, individual observations of the training data set itself may comprise tags or markers which can be used to separate the training data into statistically distinct subsets with respect to demand and/or other characteristics.

Using the training data sources 105, the forecaster 150 may train a recurrent neural network model 152 which can be used to generate demand forecasts for a variety of items in the depicted embodiment. In at least some embodiments, a plurality of demand time series (e.g., all the time series available) may be used collectively to train the model. In at least some embodiments, the forecaster may perform one or more compensation operations in response to a detection of skewed demand distribution, e.g., prior to or during training. That is, the manner in which various groups of time series are treated during the training of the RNN model may differ in such embodiments. A number of different compensation operations may be used in different embodiments, depending for example on the nature of the statistical differences detected, the computing and/or storage resources available at the forecaster 150, and so on. For example, sub-sampling may be used to reduce the relative impact of more frequent demand behaviors, multiple training examples may be generated from a single time series representing less frequent demand behavior (or for item categories for which only a few observed training examples exist) by using different starting points, different groups of time series may be assigned different weights, and/or the inputs and outputs of the RNN model may be re-scaled or normalized by dividing by total aggregated demand in various embodiments. Further details regarding various types of compensation operations which may be performed in different embodiments are provided below.

After the RNN model 152 has been trained, it may be used to generate probabilistic demand forecasts, e.g., in response to requests 170 received via programmatic interfaces 172. A number of different types of programmatic interfaces, such as web-based consoles, application programming interfaces (APIs), command-line tools or graphical user interfaces may be implemented by the forecaster in different embodiments to enable forecasting requests to be submitted. A given request may indicate, for example, a particular item or a set of items for which forecasts are to be generated, a forecast time interval (e.g., a number of weeks or months in the future), and/or other parameters such as a target prediction time by which the forecast is to be provided or desired confidence intervals for the predictions. In at least one embodiment, in order to produce a probabilistic rather than a point forecast, the RNN model 152 may be executed multiple times, and the predictions generated by each execution may be aggregated to provide the probabilistic forecast. In an embodiment in which the forecast demand for an item for a particular time step is sampled to generate at least a part of the input used for the next time step in the RNN, running the model several times may result in different samples being selected as inputs in each execution, and as result a range of predictions may be produced by the individual executions, from which a probabilistic distribution of demand forecasts 180 may be generated.

Forecasts 180 may be generated in at least some embodiments even for items which were not represented in the training data set, or for which very few observations were included in the training data—e.g., input comprising an indication of a similarity between a new item and a set of items represented in the training data may be sufficient to generate a probabilistic forecast for demand for the new item. In at least some embodiments, the forecast request 170 may include a demand time series for an item for which the forecast is to be generated, as well as various other types of feature metadata such as item category, price, "age" or timing of introduction of the item in the inventory, marketing information about the item, and so on. The demand time series and feature information may be used as part of the input for the executions of the trained model in such embodiments. In various embodiments, the forecaster 150 may employ more than one RNN—e.g., an encoder RNN and a decoder RNN may be used as discussed below in further detail. A representation of the requested probabilistic forecast 180 may be provided, e.g., via a programmatic interface, to a forecast consumer such as an ordering system 185 in the depicted embodiment.

Recurrent Neural Network Models

Artificial neural network models of various types, such as feed-forward networks as well as recurrent neural networks (RNNs), have been growing in popularity for machine learning applications in recent years, especially as opportunities for performing complex large scale computations (such as gradient calculations) at relatively low cost have increased. In contrast to at least some types of traditional feed-forward networks, in which inputs and outputs are typically assumed to be independent, recurrent neural networks may be used for making predictions regarding sequences of data, in which the order of input data elements and output data elements is significant. For example, recurrent neural network models may be used to predict the next word expected in a sentence, given the previous few words, or to translate text from one language to another. In both these examples, the ordering of the words used as input may be quite important with respect to making the predictions. RNN models of one or more types may be used in various embodiments for demand forecasting. RNNs may be described as "recurrent" because similar computations (e.g., using repeating units of the neural network) may be performed for every element of a sequence such as a demand time series, with the output often being dependent on the previous computations. RNN models may be thought of as having a "memory" which captures information about what has been calculated so far. At least in principle, RNNs can make use of information in arbitrarily long sequences—for example, as mentioned earlier, demand observations collected over several years may be used in some embodiments to train the RNN to generate probabilistic forecasts for various intervals in the future, thereby automatically taking seasonality effects into account.

Figure 2:
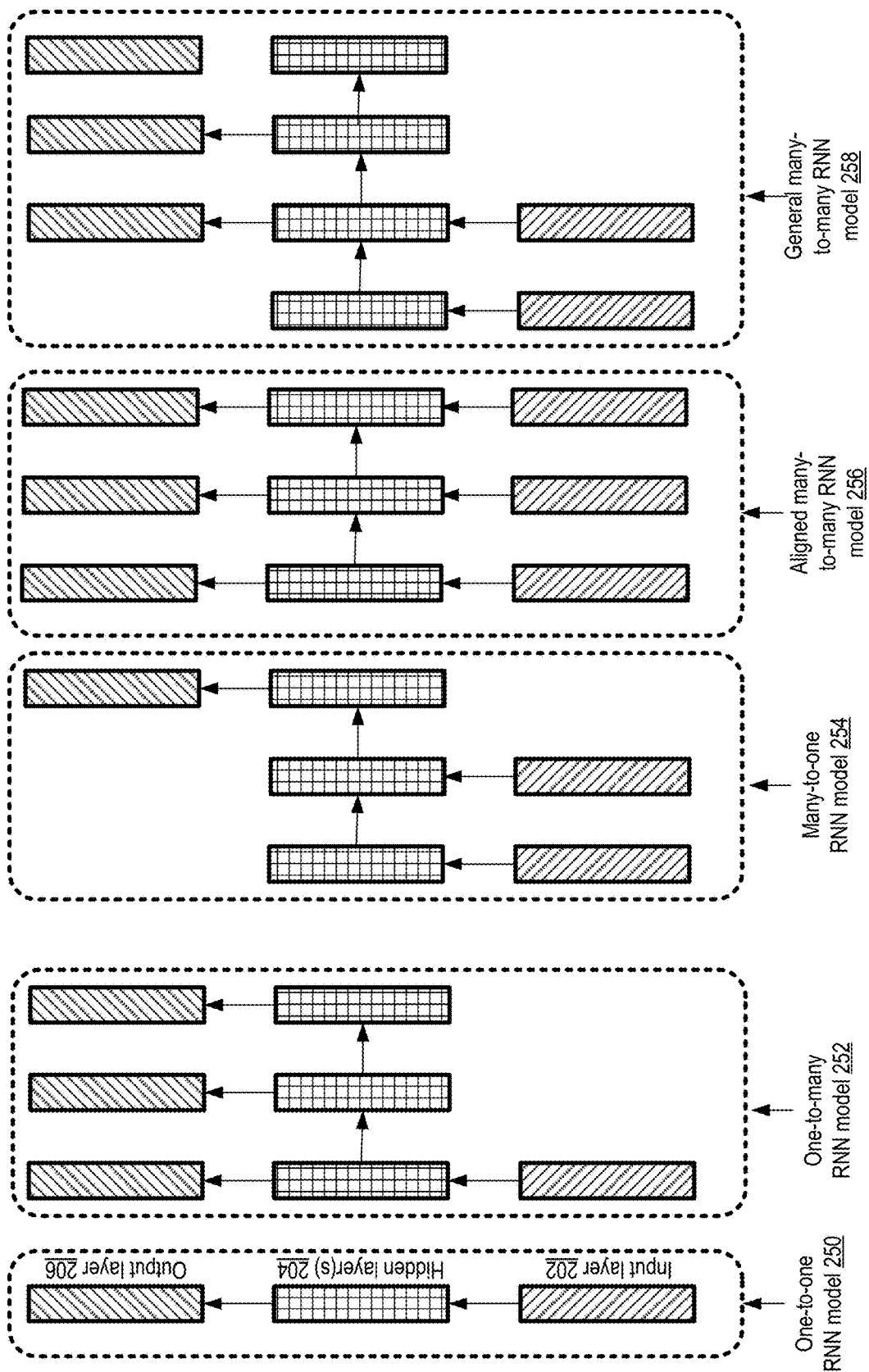
FIG. 2 illustrates examples of combinations of input and output sequences for neural network models, according to at least some embodiments.

RNN models may be characterized based on the sizes of their input and output sequences in some embodiments. FIG. 2 illustrates examples of combinations of input and output sequences for neural network models, according to at least some embodiments. In a one-to-one RNN model 250, computations may be performed on a single element of an input sequence (input layer 202), for example using one or more hidden layers of nodes 204, to produce a single element of the output sequence (output layer 206). In a one-to-many RNN model 252, several elements or time steps of the output sequence may be generated using a single input sequence element or time step, and one or more hidden layer elements. In a many-to-one RNN models 254, a single element or time step of the output sequence may be generated using several elements or time steps of the input sequence and the hidden layer. Two types of many-to-many RNN model architectures (which may also be referred to as sequence-to-sequence RNN model architectures) are shown by way of example in FIG. 2—aligned many-to-many RNN model 256 and general many-to-many RNN model 258. As indicated by their name, multiple input time steps or sequence elements (e.g., M elements) may be used to obtain multiple output time steps or sequence elements (e.g., N elements, where M may or may not equal N in the general case) using many-to-many RNNs in various embodiments. In the aligned many-to-many RNN approach, a fixed alignment is assumed between input elements and output elements, which may not necessarily work well for demand forecasting, where for example the specific date on which the intra-year maximum demand occurs may vary from year to year based on the dates at which various holidays occur. In at least some embodiments, the general many-to-many RNN model architecture 258 may be used for demand forecasting. Depending on the specific forecasting queries expected to be processed, in some embodiments one or more of the other architectures shown in FIG. 2 may also or instead be used.

Various combinations of parameters and hyperparameters used during the training phase of a general many-to-many RNN model, such as the number of input sequence elements used during a particular set of training iterations, the number of output demand values forecast, the alignment of the output with respect to the input, the types of computations performed in the hidden layers, the number of hidden layers, etc. may be selected by the forecaster in various embodiments. In at least one embodiment, a knowledge base may be used to record the degree to which different combinations of hyperparameters and parameters led to accurate forecasts for various input inventories, and the knowledge base may be used to determine values of the hyperparameters, the structure of the RNN model used during training, and so on. After the RNN model has been trained, in various embodiments it may be used to generate predictions for arbitrary requested output sequence lengths, given arbitrary input sequence lengths.

Figure 3:
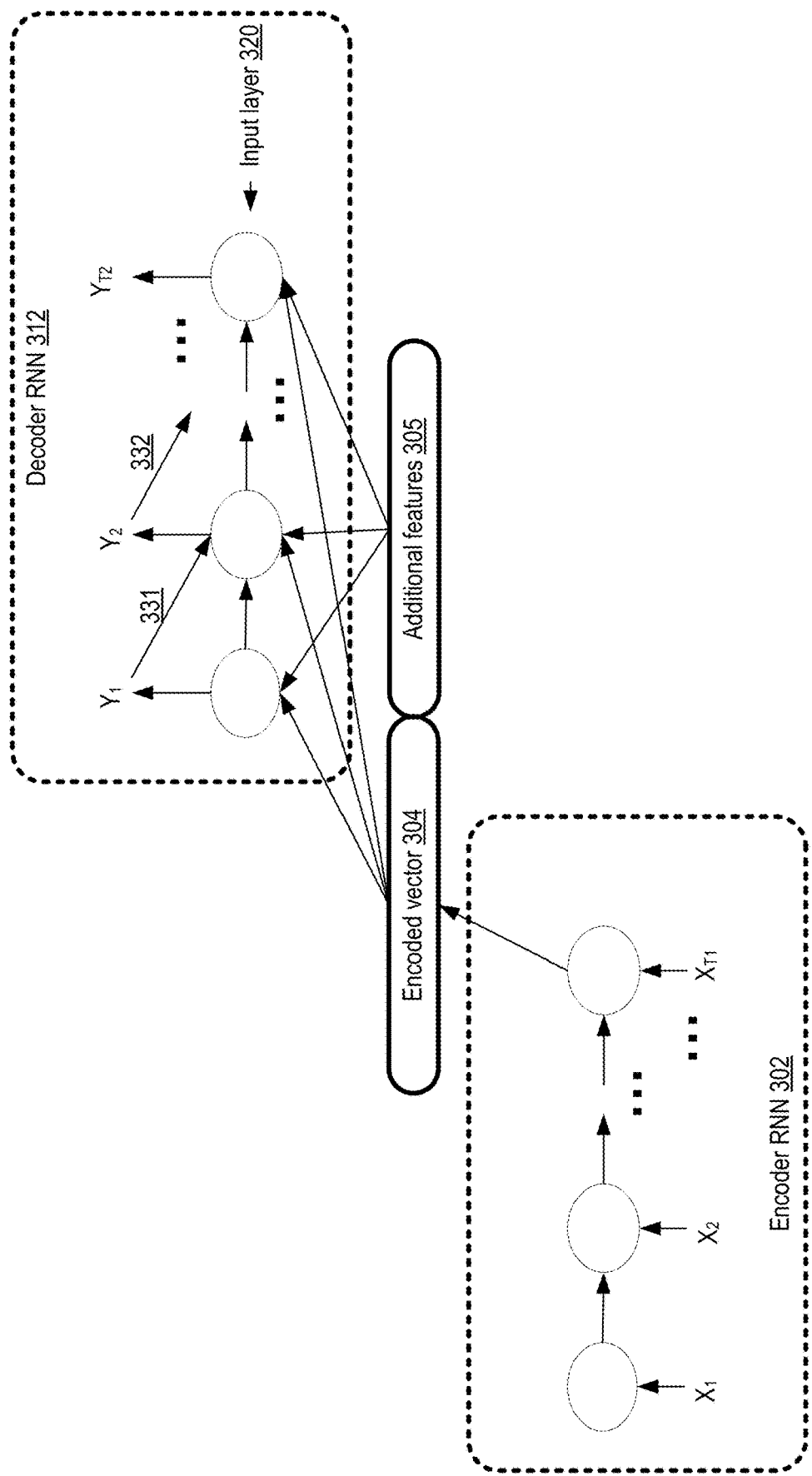
FIG. 3 illustrates an example of a use of a combination of an encoder recurrent neural network and a decoder recurrent neural network to generate probabilistic demand forecasts, according to at least some embodiments.

As mentioned earlier, in at least one embodiment multiple RNNs may be used for demand forecasting. FIG. 3 illustrates an example of a use of a combination of an encoder recurrent neural network and a decoder recurrent neural network to generate probabilistic demand forecasts, according to at least some embodiments. In the depicted embodiment, T1 elements of input data, labeled $X_1, X_2, \ldots, X_{T1}$ (which may for example include demand observations as well as feature metadata) are to be used to predict T2 elements of an output sequence labeled $Y_1, Y2, \ldots, Y_{T2}$. An encoder RNN 302 may be used to transform the input elements into an encoded vector representation 304 in the depicted embodiment. The vector representation 304 may represent a compressed form of the input information in some embodiments—e.g., there may be fewer elements in the vector than the number of input data items themselves. A decoder RNN 312 may take the vector 304, as well as a set of additional features 305 (which may also be represented as a vector in at least some implementations), as input for various time steps in the depicted embodiment. Any combination of a number of factors which may influence demand may be represented in the additional features 305 in various embodiments, such as recent demand observations which were not included in the input to the encoder, out-of-stock periods, discount sale periods, holiday dates, and the like. In addition, as indicated by the arrows labeled 331, 332 etc. from the output to the input layer 320 of decoder RNN 312, for a given time step, the predicted output from the previous time step may also be fed back (e.g., using sampling from a probability distribution of the output) to form part of the input for the current time step.

The RNNs 302 and 312 shown in FIG. 3 may be described as unidirectional, in that the horizontal links between the repeating units, as well as the arrows from the outputs Y1 in the decoder are directed only towards units corresponding to future time steps (towards the right as the figures are drawn). In at least some embodiments, bidirectional RNNs, in which at least some information also flows in the reverse direction (from right to left as FIG. 3 is drawn) may be used for the decoder, the encoder, or both the decoder and the encoder. For example, links from a repeating unit corresponding to time step $T_k$, back to one or more units corresponding to $T_{k-d}$ where d>=1 may indicate that the occurrence of a holiday in the future (on the date corresponding to $T_k$) may influence demand during some time period prior to the holiday.

In various embodiments, a system at which the recurrent neural network techniques described herein are implemented may comprise memory for storing respective data structures representing artificial neurons or nodes of the input layer(s) of the neural network models, the hidden or intermediary layers, and the output layers. The memory may also comprise respective sets of executable instructions for performing the computations at each of the different layers of the models, e.g., during the training of the model and during post-training prediction runs. The memory designated for the input layers may, for example, store values of the input features, and instructions for processing the input features. The memory designated for the hidden or intermediary layers may be used to receive and aggregated the results of the processing performed at the input layers, compute results of functions on the received data, and transmit the results to the output layer. The memory used for the output layer may in turn be used for instructions that examine the intermediate results produced by the hidden layers, and store the output values of computations performed on the intermediate results. A variety of data structures may be used for storing the inputs to the neural network models in different embodiments, the intermediate results, the output values, as well as weights and biases associated with the nodes. Such data structures may comprise, for example, vector data structures, matrix data structures, arrays, lists, data frames, and the like, depending on the implementation in various embodiments.

Figure 4:
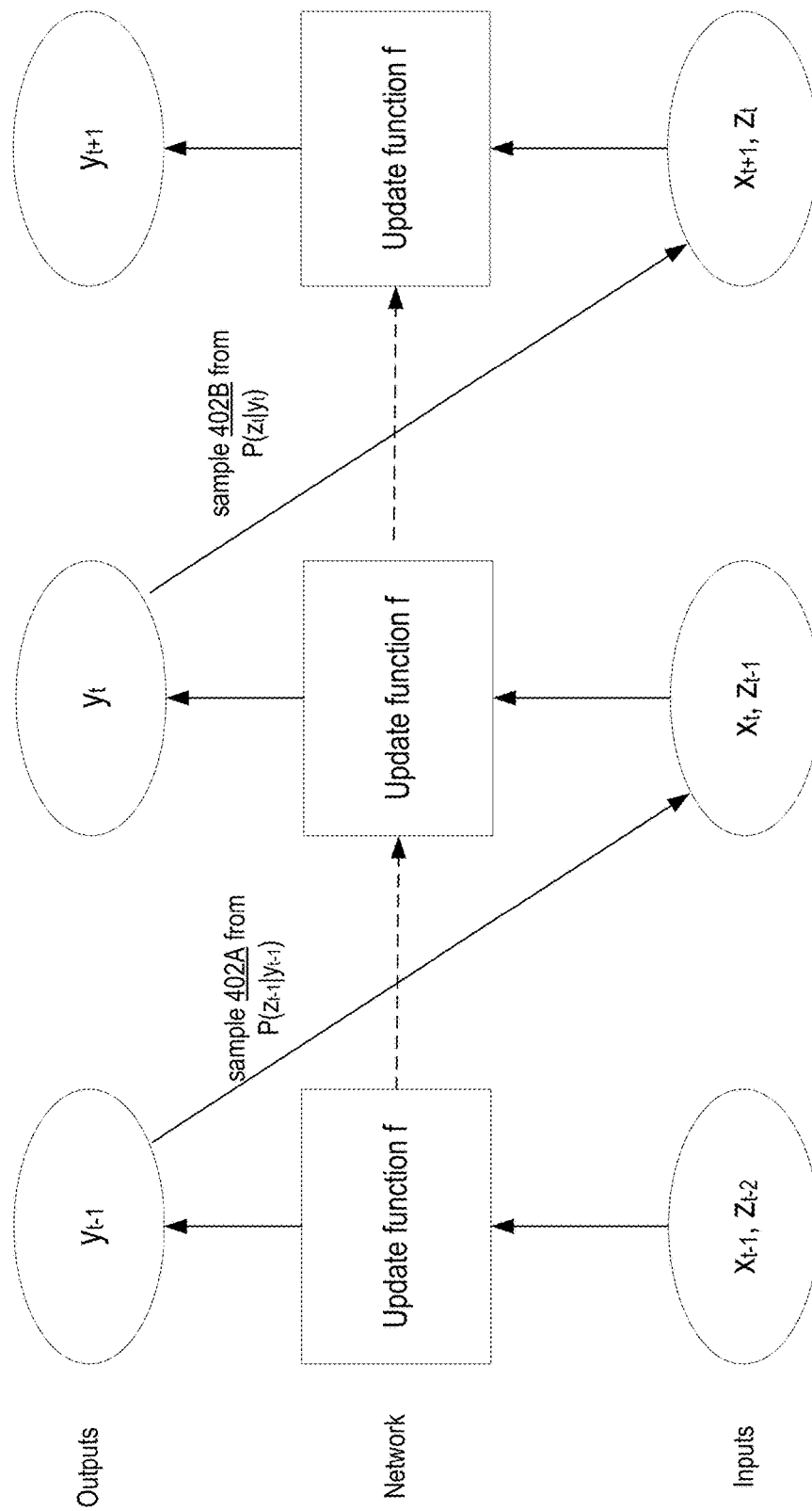
FIG. 4 illustrates an example sampling-based technique which may be used to generate at least a portion of the input to a decoder recurrent neural network, according to at least some embodiments.

FIG. 4 illustrates an example sampling-based technique which may be used to generate at least a portion of the input to a decoder recurrent neural network, according to at least some embodiments. In the context of FIG. 4, let $z_{it}$ represent the demand of a time series i at time t (the index i is dropped in the following discussion, since the discussion applies equally to all the time series being considered). In addition, let $x_t$ denote features that represent some set of information known about the time series at time t, for instance the presence of a promotion at time t. In some embodiments, $z_t$ may be predicted by choosing a distribution to fit $z_t$ depending on latent variables $y_t$ and then utilizing a model which is updated given observations. A general form of the update equation may comprise the following in such embodiments:

$$(y_t, l_t) = f(x_t, l_{t-1}, \theta)$$ Equation 1

In Equation 1, $l_t$ is a state at time t and $\theta$ represents inferred parameters. In the decoder RNN shown in FIG. 4, the input $x_t$ (which may be produced at least in part using an encoder RNN such as that discussed in the context of FIG. 3) may comprise features in the prediction range, e.g., promotions in the future or seasonality features. At various steps in the depicted embodiment the decoder RNN may also receive the demand $z_t$ from the last time step as input. The model may predict latent parameters $y_t$ of a distribution $P(z'_t | y_t)$ for the demand $z'_t$ at the next time step. A sample (such as sample 402A or 402B) may be obtained from the model and fed back as part of the input for the next time step. Thus, in the depicted embodiment, using one recurring portion or unit of the RNN, parameters for a first demand distribution corresponding to particular time step may be predicted; then, a sample from that predicted distribution may be fed back as input to another recurring portion or unit of the RNN, which uses that sample to predict parameters for a second demand distribution corresponding to the next time step. A number of different techniques may be used to obtain the probabilistic demand distributions from which samples 402A, 402B and the like are sampled in different embodiments. In one embodiment, parameterized distributions may be used—e.g., parameters of a negative binomial distribution corresponding to an integer-valued time series may be predicted, or parameters of a Gaussian distribution corresponding to a real-valued time series may be predicted. In at least one embodiment, it may be possible to avoid specifying the type of the distribution, e.g., by utilizing an approximate method such as a method employing generative adversarial networks.

Let the targeted forecast interval is denoted by [T1, T2] in the embodiment depicted in FIG. 4. To train the network, Equation 1 may be unrolled and the samples $z'_t$ may be returned as estimates of $z'_t$ for $t \in [T1, T2]$. The probability over a sequence of estimates may be given by Equation 2:

$$P([z'_{T1}, \ldots, z'_{T2}]) = \prod_{t=T1}^{T2} P(z_t | y_t)$$ Equation 2

Note that since $y_t$ depends on all previously drawn samples $z'_{t' < t}$, this generates a sequence of dependent samples and time correlation can be modeled. The negative log likelihood expressed by Equation 3 may be used as the loss function for the decoder RNN:

$$L([z'_{T1}, \ldots, z'_{T2}]) = -\sum_{t=T1}^{T2} \log P(z_t | y_t)$$ Equation 3

The function f indicated in FIG. 4 may be expressed using various types of neural layers in different embodiments. Its gradient may be computed using the back-propagation through time (BPTT) technique in at least some embodiment.

In embodiments such as those shown in FIG. 4, feeding in the previous sample versus the observed demand during training may be important in order to generate correlated samples and in order for the decoder to perform the same task during training as during prediction. One potential issue with this is that at the beginning of the optimization process, the weights of the network may be randomly initialized in some embodiments, and the estimates $y_t$ may be relatively poor. This may lead to either numerical issues or slow convergence. This problem may be addressed in at least one embodiment with a technique which may be referred to as scheduled sampling. According to this technique, the observed demand value (or true target) $z_{t-1}$ is used in the beginning of the training. As the training progresses and the model improves, the true targets may be replaced by the sampled $z'_{t-1}$ with increasing probability, such that finally towards the end of the training only samples are fed in. In such an embodiment, a probabilistic sampling technique may thus be used to determine whether input for a particular time step is to include (a) a sample from a demand distribution predicted by the RNN model for a previous time step or (b) a demand observation corresponding to the previous time step. According to the probabilistic sampling technique, the probability of utilizing the sample may increase as the total number of training iterations increases in at least some embodiments.

According to at least one embodiment, the state $l_t$ of a basic unit used for the forecaster's decoder RNN may be updated using the update function shown in Equation 4:

$$l_t = \varphi(W * x_t + U * l_t + B)$$ Equation 4

In Equation 4, $\varphi$ represents an activation function, and vectors W, U and B are parameters learned using back propagation through time. In at least one embodiment, several basic RNN units of the kind indicated by Equation 4 may be combined or stacked. In some embodiments, more complex approaches such as LSTM (Long Short Term Memory) networks may be used.

Compensatory Operations for Skewed Training Data

Figure 5:
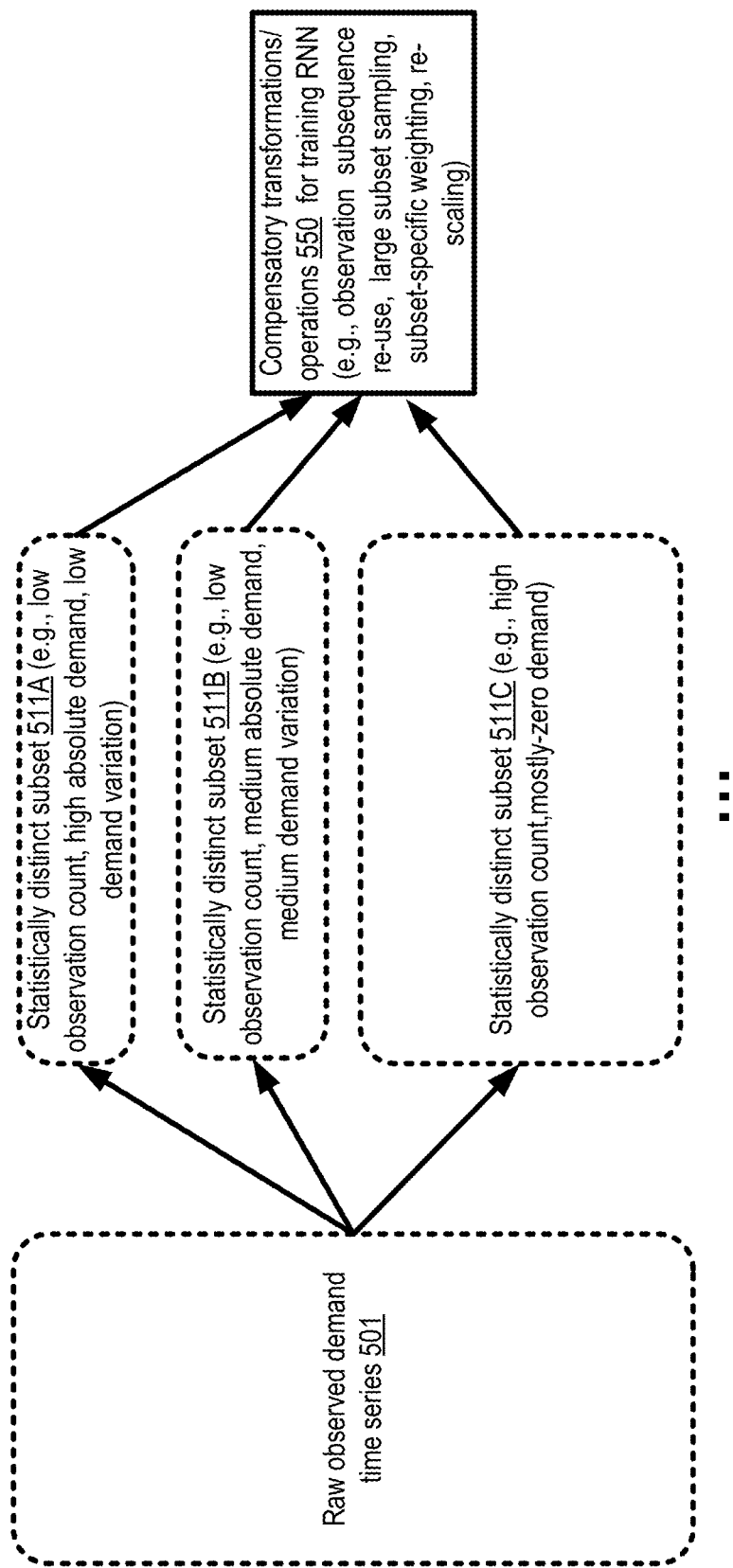
FIG. 5 illustrates an example of a use of compensatory operations to handle statistically distinct training data subsets for a recurrent neural network model, according to at least some embodiments.

As mentioned earlier, the statistical properties of some subsets of the input data set used for training may differ substantially from the corresponding properties of other input data subsets. FIG. 5 illustrates an example of a use of compensatory operations to handle statistically distinct training data subsets for a recurrent neural network model, according to at least some embodiments. It is noted that in at least some embodiments, although the net effect of the compensatory operations may be that different subsets of the training data end up being treated differently, the forecaster may not actually assign individual time series to distinct subsets, or even define boundaries between subsets. Instead, at least some of the compensatory operations may be performed dynamically, as individual time series are processed, without having to examine or classify the entire training data set (or even a portion of the data set) in advance. In the depicted embodiment, within the raw observed demand time series 501, at least three statistically distinct subsets 511A-511C may exist. Subsets 511A and 511B may each have a relatively low observation count compared to subset 511C in the example scenario shown in FIG. 5. The absolute demand values (e.g., the average number of items sold) may be highest for subset 511A and lowest for subset 511C, with items having medium absolute demand values being represented by subset 511B. The subsets may also differ from one another in the variation in demand within individual time series—e.g., subset 511A may have relatively low demand variation from observation to observation, subset 511B may have higher demand variation, while in subset C demand may exhibit intermittency with most demands being zero.

Because of the skewed demand behavior, using the unmodified observations for training the RNN model may result in the RNN's predictions being biased towards the behavior exhibited by the subsets with the highest populations. For example, if out of a million raw observations, 950,000 could be classified as belonging to subset 511C, the RNN model may tend to predict that the demand for any given item is most likely to have a similar behavior to the behavior typically exhibited by members of subset 511C. In order to train the RNN to make more accurate predictions for items with several different demand behaviors, one or more compensatory transformations or operations 550 may be performed during training in the depicted embodiment. Such operations may include, for example, observation re-use via subsequences, sampling of observations exhibiting more "common" or "usual" characteristics, assigning respective weights to different time series based on the demand behavior, and/or rescaling or normalizing magnitudes of the inputs and outputs. At least some of the compensation operations may also be referred as normalization operations in some embodiments.

In observation re-use via subsequences, according to some embodiments multiple smaller sequences may be generated from a single time series observation of a subset 511 (e.g., 511A) with a relatively low population, and the different subsequences may be treated as separate observations during training as discussed below in the context of FIG. 6. In the second approach (sampling), instead of using all the examples in a large subset (such as 511C), a smaller sample may be generated and used for training, so as to reduce the relative count of the more common behaviors in the training data in some embodiments. In some embodiments, respective training weights may be attached to the observations of different subsets, e.g., instead of using the sampling or sub-sequence approach, so that learning from observations which show more unusual behavior is weighted more heavily than would be the case of all observations were weighted identically. In at least one embodiment, the raw input and/or output values for the RNN model may be scaled or normalized (e.g., by dividing by the aggregate demand) by applying appropriate functions in another type of compensation operation. The particular compensation operation to be used, or the particular combination of compensation operations to be used, may be selected by the forecaster based at least in part on factors such as the observed levels of skew in the raw observations, the available computing capacity relative to the sized of the raw data set (e.g., sampling may be preferred to weighting if the raw data set is extremely large), client preferences provided via programmatic interfaces, and so on. In at least one embodiment, analysis of statistical differences among observations may not be performed for at least some data sets, and/or compensation operations may not be performed. In various embodiments, a system at which such compensation operations are performed may comprise memory used to store the instructions for implementing the compensation operations, as well as results of the compensation operations. For example, memory may be allocated to store respective sub-sequences of a time series (or indicators of the sub-sequences such as pointers indicating the positions of starting and ending elements of the sub-sequences within the original time series), the weights assigned to different time series, and so on in various implementations.

Figure 6:
FIG. 6 illustrates an example of the use of subsequences of a demand time series to generate multiple input examples to train a recurrent neural network model, according to at least some embodiments.

FIG. 6 illustrates an example of the use of subsequences of a demand time series to generate multiple input examples to train a recurrent neural network model, according to at least some embodiments. In the depicted example, the raw input observations available for a particular item (which may belong to a rare/unusual category with respect to one or more statistics of demand distribution) may comprise daily demand values 602 collected over a period from January 2013 to December 2016. The per-day demand observations are shown grouped by month in FIG. 6 to avoid clutter. The general many-to-many RNN model used by the forecaster in the depicted embodiment may be able to utilize input demand sequences or time series of any desired lengths during training.

Consequently, in a compensation operation intended to increase the probability that the model is able to make demand predictions which are similar to the unusual/rare demand behavior exhibited by item I1 (e.g., future predictions for I1 itself, or for other items that have similar properties as I1) the forecaster may extract several different subsequences from the observations 602 and then use each of the subsequences as a separate training example. In effect, by doing so, the relative population of training examples which represent behavior similar to that depicted by I1 may be increased, without having to generate synthetic examples in the depicted example. In the depicted scenario, three subsequence training examples extracted from the raw observation time series 602 are shown: training example TE1 or 605A comprising daily demand observations from February 2013 through September 2016, and training example TE2 or 605B comprising daily demand observations from March 2013 through October 2016. In some embodiments, the lengths of the different training example subsequences used for the RNN model may differ from one another. Corresponding to each subsequence-based training example, in various embodiments a respective prediction range may be selected, e.g., with an associated lead time. The forecaster may determine the values of various parameters associated with training the RNN model using subsequences in various embodiments, such as the number of subsequences to generate from a given raw observation time series, the lengths of the subsequences, the lengths of the prediction intervals and the corresponding lead times, etc. In at least one embodiment, a knowledge base may be used to determine values for at least some of the parameters. As mentioned earlier, other compensation operations may be used in at least some embodiments, and the forecaster may be responsible for determining values of respective sets of parameters for the particular combination of compensation techniques employed.

In some embodiments, instead of or in addition to being used to compensate for skew in demand distributions, a subsequence generation technique similar to the technique illustrated in FIG. 6 may be employed for one or more other reasons. For example, in one embodiment, if some category of items (e.g., the "jewelry" category in a general retaining environment) has very few examples in the raw training data set, additional subsequence-based examples for that category may be generated, regardless of how different the demand distributions for the category are from other demand distributions of the training data set. In another embodiment, sub-sequence based examples may be generated and used to make the model more general with respect to the timing of future targeted prediction intervals relative to the time at which the prediction is requested, to capture seasonal variations in demand more effectively, and so on. As a result of using sub-sequence based examples which start at numerous different dates within a year, for example, the model may be able to learn to make more accurate predictions a week in advance, several weeks in advance, months in advance, and so on, than if the sub-sequence based examples were not used for training.

Methods for Demand Forecasting Using Recurrent Neural Networks

Figure 7:
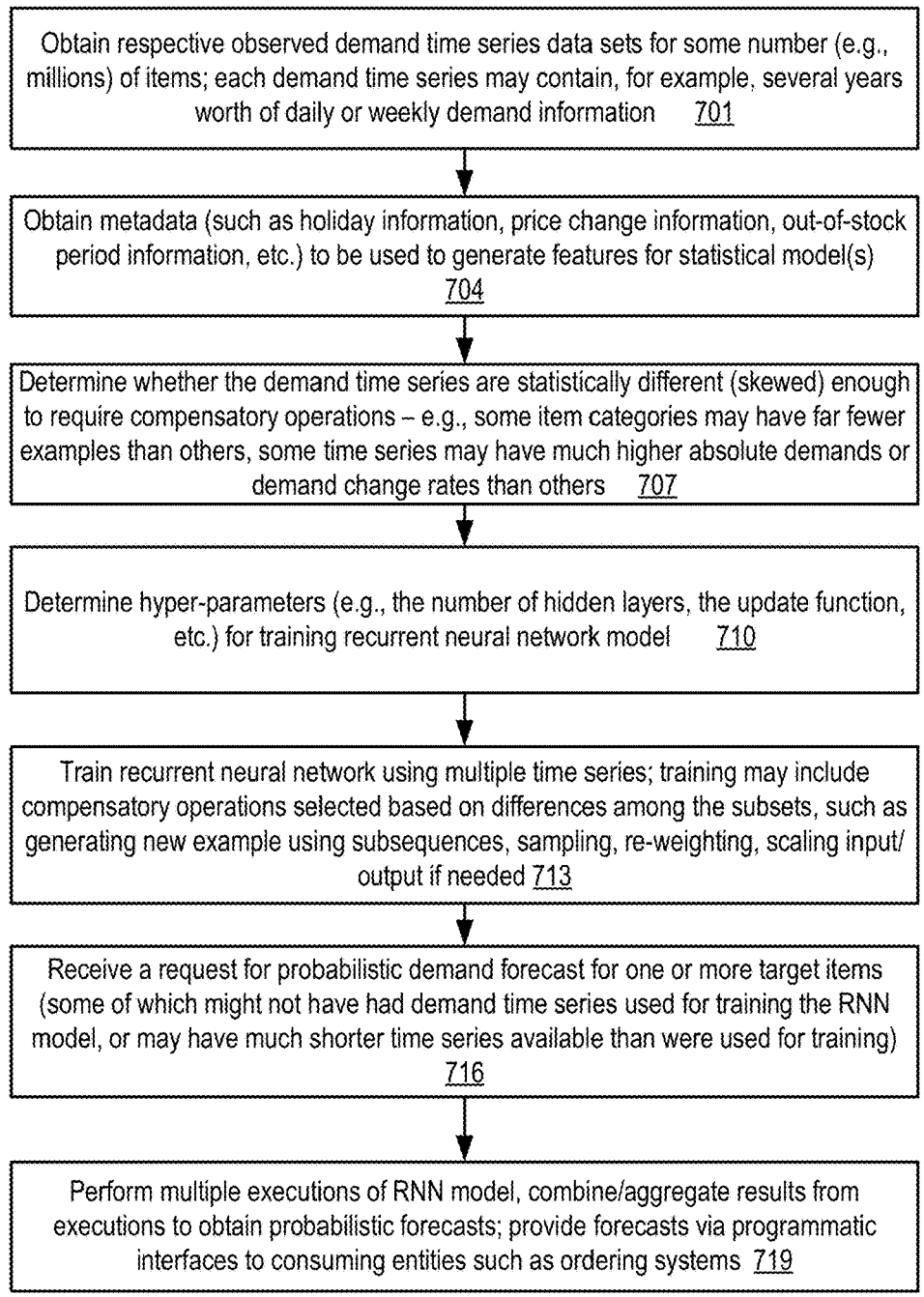
FIG. 7 is a flow diagram illustrating aspects of operations that may be performed by a demand forecaster which utilizes a recurrent neural network model, according to at least some embodiments.

FIG. 7 is a flow diagram illustrating aspects of operations that may be performed by a demand forecaster which utilizes a recurrent neural network model, according to at least some embodiments. As shown in element 701, indications of raw or observed demand time series for a plurality of items (e.g., millions of items sold by a large retail organization) may be obtained by a forecaster. As mentioned earlier, the forecaster may be implemented as part of a network accessible service in some embodiments, or as a standalone tool in other embodiments. An individual time series may include, for example, values for respective daily or weekly demands (or, as an approximation of demand, daily or weekly sales) for an item over relatively long periods of time, such as several years in some cases. Statistical properties of the demand behavior over time may vary substantially among the items in at least some embodiments—for example in one scenario some items may have large numbers of zero-demand days, while other items may have much higher demands.

A variety of metadata which may potentially affect the demand for the items may be obtained by the forecaster in at least some embodiments (element 704). Such metadata may include, for example, holiday-associated demand variation indicators, seasonality-associated demand variation indicators, sales promotion indicators, out-of-stock indicators, actual prices, and/or price change indicators. Such metadata may, for example, be converted into a vector of numerical features by an encoder RNN in some embodiments, which may then be used as input for a decoder RNN which produces the demand predictions. In at least some embodiments, some or all of the items may also have category names or identifiers associated with them. In one embodiment, the category information may be usable to classify at least some items into subsets which exhibit rare/unusual behaviors—e.g., some items may be tagged with category labels such as "fast-selling" or "slow-selling". Some or all of the metadata elements may be usable to determine similarities between items in various embodiments. In at least one embodiment, a first time series of a plurality of time series used to train the model may include a first group of demand observations for a first item corresponding to a first year, and a second group of demand observations for the first item corresponding to a second year. A particular holiday correlated with changes in demand for the first item may occur on a particular date in the first year, and on a different date in the second year. Information about the occurrence dates of the holiday may be included in the training data in at least some embodiments. Later, after the model is trained, an indication of a future date on which the particular holiday is to occur may be included in input used for one or more prediction runs of the model, and the model may be able to utilize the future data to predict demands for one or more items in such embodiments.

In the depicted embodiment, the forecaster may determine whether the distribution of the demand in the input data (or the distribution of other characteristics such as the populations of different product categories) is skewed enough to require compensatory operations—e.g., some time series may have higher absolute demands or demand change rates than others (element 707). In at least one embodiment, the existence of the skew may be assumed, e.g., based on the problem domain represented by the input data, and the forecaster may not need to do any extra work to verify that the raw input data is skewed. A preliminary statistical analysis may be performed on at least a portion of the raw demand time series in some embodiments, obtaining metrics associated with the distribution of demand within individual time series, such as mean demand, ranges of day-to-day variations in demands, etc., and the results of such an analysis may be used to estimate the extent of the skew. In one embodiment, at least a portion of the input data set may be classified into distinct subsets based on one or more types of statistical differences.

A set of hyper-parameters for training an RNN model for predicting demand may be identified (element 710). Such hyper-parameters may include, for example, the lengths of the input and output sequences to be used for a decoder RNN, the number of hidden layers in the decoder RNN, the structure and properties of the encoder RNN etc. In some embodiments, entries of a knowledge base accessible by the forecaster may be used to select hyper-parameter values.

The RNN model may be trained using a plurality of input time series (which may in some cases time series derived from the raw input data) (element 713). The training may include one or more compensatory operations such as generating new observation example from subsequences, sampling, re-weighting, applying normalizing/scaling functions to input and/or output values in at least some embodiments. The particular compensation operations and/or the parameters for the compensation operations may be selected, for example, based at least in part on the skew in the distributions of the input data set. As mentioned earlier in the context of FIG. 4, samples from the demand distribution at one stage or time-step of the model may be fed back as part of the input for a subsequent stage or time step in some embodiments. In at least some embodiments, seasonal variations in demand for some or all of the items used to train the RNN model may automatically be incorporated or learned as a result of using different time periods for respective training examples. To express the demand distributions, in some embodiments parametrized distributions may be used, such as a negative binomial distributions for integer time-series or Gaussian distributions for real value time-series. In one embodiment, e.g., to avoid the need of specifying the type of the demand distribution type, approximate methods may be used to obtain the demand distributions, such as methods which use generative adversarial networks.

The forecaster may receive a request for a probabilistic demand forecast for one or more target items (some of which might not have had demand time series used for training the RNN model, or may have much shorter time series available than were used for training the RNN model) (element 716). The request may include, for example, information which can be used to determine the similarity of a target item to various subsets of the items whose demand observations were used for training. For example, in some embodiments, the model may be able to determine similarities between items based on item prices or price ranges, a product category associated with the item, item introduction timing information (e.g., when the item was added to an inventory represented by the input demand time series, which may also be referred to as the "age" of the item), or marketing information associated with the item (such as promotion periods, price reductions, etc.). Such information may be used to determine input features to be provided as input to the trained model for one or more executions in at least some embodiments. The request may also include a time series of demand observations for the target item itself, which may in some cases be shorter (i.e., have fewer elements than) than the time series for various other items used as part of the training set for the RNN model.

The forecaster may perform multiple executions of the trained RNN model in the depicted embodiment (element 719). Each execution may provide, for example, a vector of respective predicted values of demands for each day or week of a targeted forecast period. The results of the individual runs may differ from one another, e.g., due to the use of sampling to generate demand values as inputs at various stages as discussed in the context of FIG. 4. Results from multiple executions may be aggregated or combined to obtain probabilistic forecasts (e.g., predicted demand with associated confidence intervals) similar to those discussed below in the context of FIG. 9. The probabilistic forecasts may be provided via programmatic interfaces to consuming entities such as ordering systems in various embodiments. The input provided for the prediction runs of the RNN model may include, for example, a time series of demand of the target item itself (if such a time series is available) and/or metadata entries which can be used to identify similarities between the target item and items used for training. As mentioned earlier, an encoder RNN may be used to convert the supplied input into a feature vector to be used as part of the input of a decoder RNN in some embodiments. It is noted that in various embodiments, some of the operations shown in FIG. 7 may be implemented in a different order than that shown in the figure, or may be performed in parallel rather than sequentially. Additionally, some of the operations shown in FIG. 7 may not be required in one or more implementations.

Example Demand Time Series and Forecast Queries

FIG. 8 illustrates an example of a demand data set for an item, and examples of forecast-related queries for the item, according to at least some embodiments. Time series 802 shows example per-day sales for an item I1 over a 35-day time period which may be obtained by a forecaster 850. The per-day sales are also plotted in graph 823. The majority of the sales (28 out of the 35 observations) are zero—that is, no purchases of item I1 are recorded on most days. On five days, a single instance of item I1 is sold, and more than one instance was sold only on two days. Such intermittent demand behavior may cause computational difficulties for some types of traditional forecasting techniques which do not utilize recurrent neural networks.

In addition to the raw sales/demand data, some metadata (which may potentially have some explanatory role regarding the sales of I1 on at least some days) may also be made available to forecaster 850 in the depicted embodiment. For example, with respect to the time period between March 4 and March 6, the metadata may indicate that a temporary price reduction for I1 was in effect, and this may have had some bearing on the increased sales on March 5 and March 6. In addition, forecaster 850 may also be informed programmatically that item I1 was out of stock on March 14 and March 15, which means that there could not have been non-zero sales on at least those days even if there was non-zero customer demand.

Table 860 shows a few examples of the kinds of queries regarding future I1 demand that may be posed programmatically to the forecaster 850. Some customers may want to know how many total sales should be expected to occur in a given data range. Others may want to know how much a particular discount might affect sales, or the probability of selling a particular number of instances of I1 on a single day. In at least some embodiments, programmatic interfaces that allow customers to submit forecast queries similar to those shown in FIG. 8 may be implemented. In one embodiment, natural language query interfaces may be supported; in another embodiment, a query interface based on a variant of the structured query language (SQL) may be supported. Once an RNN-based model of the kind above is trained, predictions to answer queries similar to those shown in table 860 may be generated very quickly in at least some embodiments. Since the predictions may be obtained very quickly, it may be possible to explore a wide variety of scenarios (e.g., with different levels of discounts, etc.) fairly rapidly and without excessive costs, especially compared to some other forecasting techniques.

Figure 9:
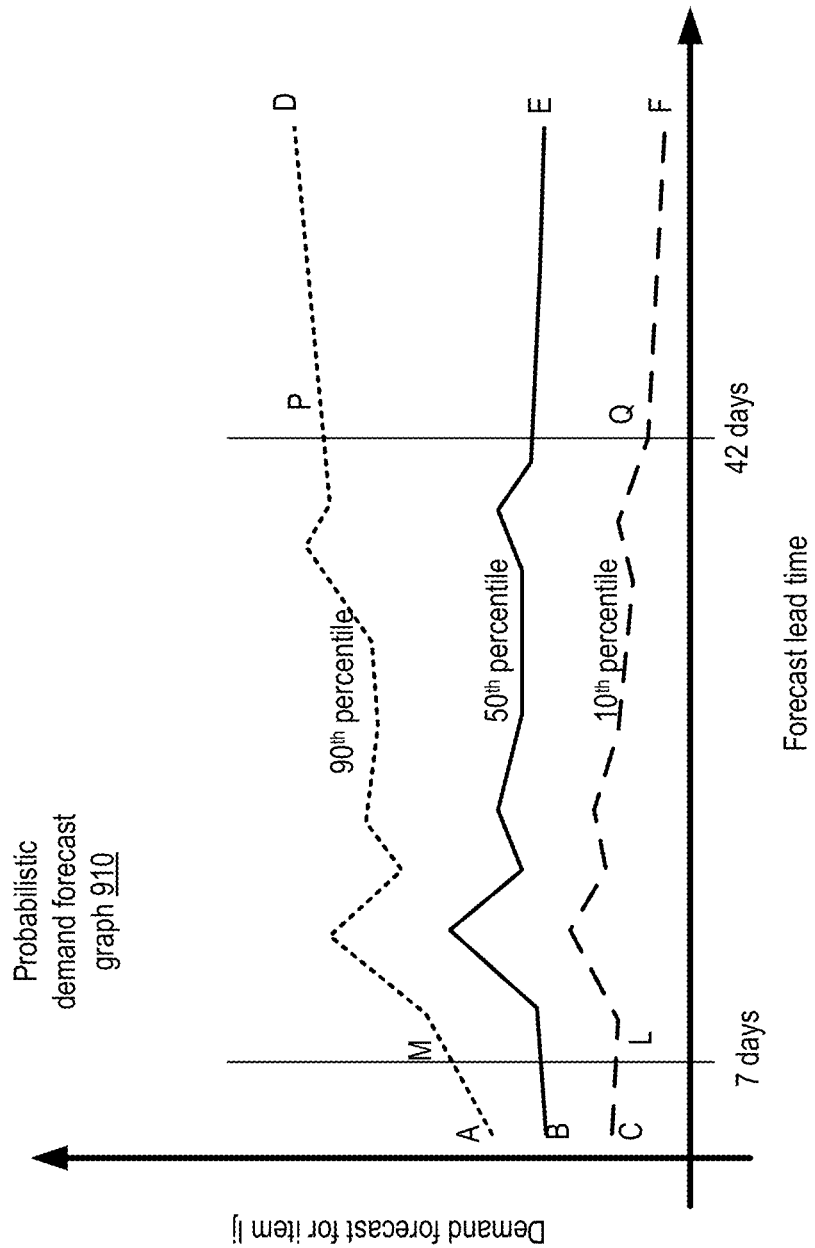
FIG. 9 illustrates an example of a probabilistic demand forecast graph which may be produced by a forecaster using multiple executions of a recurrent neural network model, according to at least some embodiments.

FIG. 9 illustrates an example of a probabilistic demand forecast graph which may be produced by a forecaster using multiple executions of a recurrent neural network model, according to at least some embodiments. In the depicted embodiment, forecast lead time (i.e., the difference between the time for which the forecast is to apply, and the time when the forecast is predicted) increases from left to right on the X-axis of graph 910, and the lead time is expressed in days. The predicted demand for a particular item Ij of an inventory is represented along the Y-axis.

The demand curves AMPD, BE, and CLQF correspond respectively to a $90^{th}$ percentile confidence level, a $50^{th}$ percentile confidence level, and a $10^{th}$ percentile confidence level with regard to the demand for the item. Multiple (e.g., hundreds or thousands) of executions of the RNN-based model may be performed relatively quickly in some implementations, each resulting in a different demand curve over the prediction interval due to the use of sampling-based feedback techniques discussed earlier. The respective curves corresponding to the individual executions may be analyzed and aggregated to obtain the probabilistic result shown in FIG. 9. In at least some embodiments, a programmatic interface (e.g., a web-based console or a graphical user interface) may be used to display probabilistic demand graphs such as graph 910. In at least one embodiment, category-level probabilistic forecasts, or probabilistic forecasts for groups of items rather than individual items, may be provided by the forecaster.

As indicated by the relative widening of the gap between the $10^{th}$-percentile and $90^{th}$-percentile curves as the lead time increases, the uncertainty of the forecast produced using the RNN approach may increase as time periods further in the future are considered. For example, 7 days in the future, the gap between the $90^{th}$ percentile and the $10^{th}$ percentile corresponds to the length of segment ML, while 42 days in the future, the gap corresponds to the longer segment PQ. In some embodiments, forecast customers may be able to programmatically indicate the particular confidence levels for which they wish to view forecasts.

Example Forecaster Subcomponents

Figure 10:
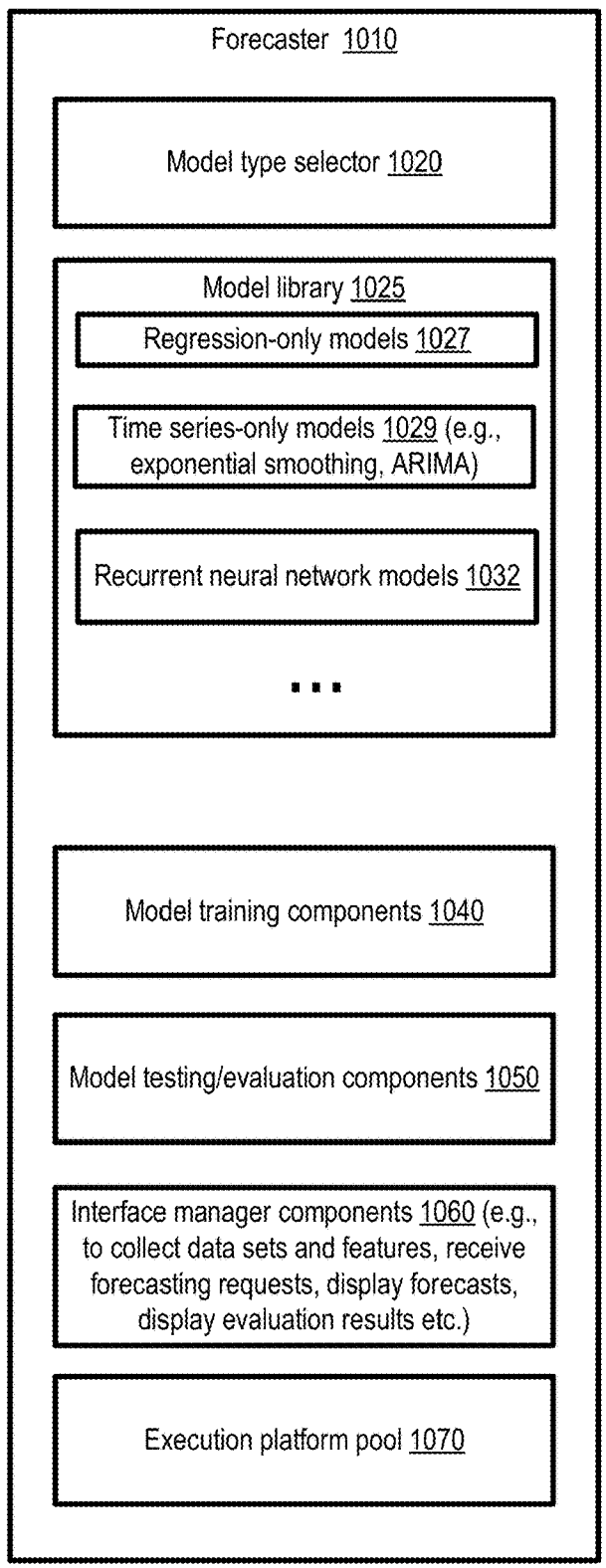
FIG. 10 illustrates example subcomponents of a forecaster, according to at least some embodiments.

In some embodiments, RNN models may represent one of several types of a library of forecasting models of a general-purpose forecaster. FIG. 10 illustrates example subcomponents of a forecaster, according to at least some embodiments. Such a forecaster may be implemented using one or more computing devices of a more general artificial intelligence system or machine learning system in various embodiments, which may be used to make predictions using various types of techniques and models. As shown, a forecaster 1010 may comprise a model type selector 1020, a model library 1025, model training components 1040, model testing/evaluation components 1050, interface management components 1060, and an execution platform pool 1070 in the depicted embodiment.

The model type selector 1010 may, for example, examine at least a portion of a time series data set for which forecasts are to be made, and identify the particular modeling methodology or methodologies to be employed. Depending on resource constraints and other factors, in some embodiments a decision may be made to use utilize more than one modeling methodology for the same input data set. In some cases, for example, in which a fairly sophisticated methodology such as the RNN modeling approach discussed above is selected for a given data set, a simpler modeling technique (e.g., one based solely on exponential smoothing) may also be employed to produce a baseline set of forecasts in addition to the forecasts made using the sophisticated approach. The results of the simpler baseline forecasting may be used, for example, as a sanity check with respect to the results of the composite modeling approach.

The model library 1025 may support a variety of modeling techniques with different levels of sophistication and resource requirements. For example, regression-only models 1027, time-series-only models 1029 (such as exponential smoothing models or autoregressive integrated moving average (ARIMA) models), as well as RNN-based models 431 of the kind discussed earlier may be available. In some embodiments, other types of models such as composite latent state models which include deterministic components and random process components may be included in model library 1025.

The model training components 1040 may be responsible for determining whether compensation operations of the kind discussed earlier are to be used on a given raw training data set, and if so, implementing the selected compensation operations as a preliminary phase of the training of the RNN model using some number of execution platforms of pool 1070. The model testing/evaluation components 1050 may be responsible for obtaining predictions with respect to selected test time series using a trained version of the model and determining the accuracy of the predictions (e.g., using any of a variety of metrics such as the mean absolute error). Multiple iterations of training and testing may be performed in various embodiments, with the iterations differing from one another in initial parameter settings, hyper-parameter values, the training and test subset populations, and so on.

Interface manager components 1060 may be responsible for interactions with external entities such as the customers interested in the forecasting results, the data sources from which the input data is obtained, automated ordering systems which may generate orders for re-stocking items based on the forecasts, and so on. A variety of programmatic interfaces may be implemented in different embodiments, including for example web pages or web-based consoles, graphical user interfaces that are not web-based, command-line tools, application programming interfaces and the like.

The execution platform pool 1070 may comprise a number of virtual and/or physical machines in various embodiments. In some embodiments, at least some of the platforms may be organized as nodes of a cluster, with a built-in infrastructure for load balancing, scaling up and down as the workload level changes, fault-tolerance (e.g., using automated failover) and the like. As mentioned earlier, in at least one embodiment the computations associated with forecasting for different subsets of a large inventory may be distributed among different nodes of an execution platform cluster.

Machine Learning Service

Figure 11:
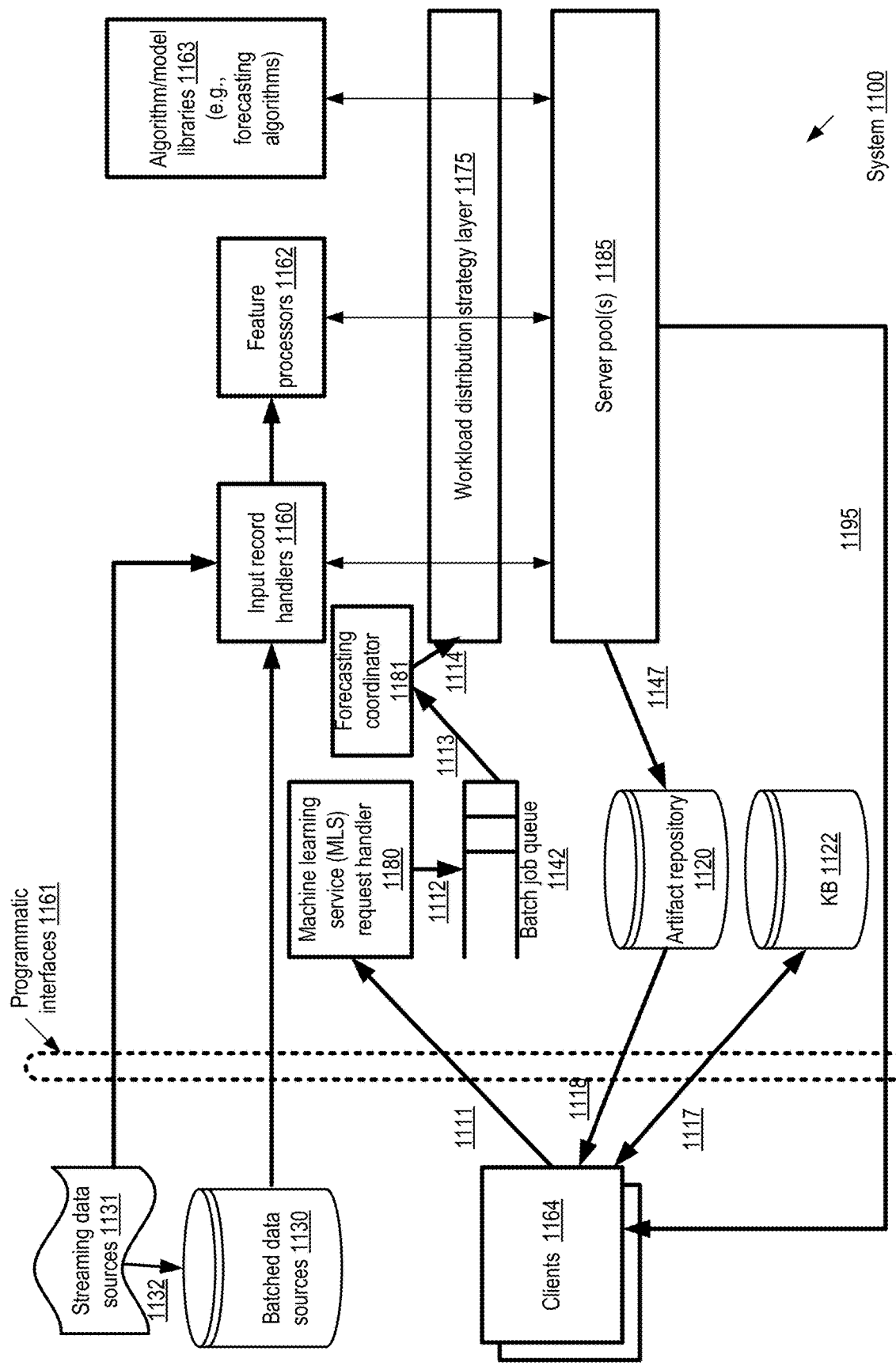
FIG. 11 illustrates example components of a machine learning service which may be used for generating forecasts for time series data, according to at least some embodiments.

In some embodiments, the RNN-based algorithms for demand forecasting described above may be implemented at a machine learning service of a provider network. FIG. 11 illustrates example components of a machine learning service which may be used for generating forecasts for time series data, according to at least some embodiments. Networks set up by an entity such as a company or a public sector organization to provide one or more services (such as various types of multi-tenant and/or single-tenant cloud-based computing or storage services) accessible via the Internet and/or other networks to a distributed set of clients or customers may be termed provider networks in this document. Provider networks may also be referred to as "public cloud" environments. The machine learning service of system 1100 of FIG. 11 may include numerous physical and/or virtual computing devices, with each such device comprising one or more threads of execution. A large number of such computing devices spread over numerous geographically-dispersed data centers may be used for machine learning tasks or statistical computing tasks in some provider networks.

In the depicted embodiment, input data for various types of analysis (including forecasts for time series) may be obtained from at least two types of sources: batched data sources 1130 and streaming data sources 1131. In addition to a forecasting coordinator 1181 responsible for managing the implementation of the algorithms discussed earlier, the machine learning service (MLS) may comprise a request handler 1180, a knowledge base 1122 and an artifacts repository 1120. The knowledge base 1122 may represent a growing collection of entries representing insights gained during earlier instances of the use of forecasting techniques (as well as other algorithms) for a variety of data sets, and may be used to guide some of the decisions made by the forecasting coordinator 1181, such as the selection of the particular type of forecasting technique to be used for a given set of input data, details of the algorithm such as the architecture or structure of the RNNs used, initialization parameters, etc. The artifacts repository 1120 may be used to store interim and/or final results of forecasting operations, values of the parameters selected, and so on.

A set of programmatic interfaces 1161 may be implemented at the machine learning service for interactions with clients 1164 in the depicted embodiment. The interfaces may include, for example, one or more web-based consoles or web pages, application programming interfaces (APIs), command-line tools, graphical user interfaces (GUIs) or the like. Using interfaces 1161, clients 1164 may, for example, submit a forecasting request with respect to observation records which can be obtained from a specified data source such as a streaming data source 1131 or a batched data source 1130. The data source may be identified, for example, by providing access information such as a network address, a database address, and/or a storage device address. In some implementations an SQL-based programmatic interface may be included in programmatic interfaces 1161, enabling clients to submit forecast queries (and view results corresponding to such queries) using familiar and easy-to-use interfaces.

In some cases, the raw data records and/or associated metadata (such as the seasonal, price-change related and other metadata discussed earlier with respect to demand data) of a given data set may be pre-processed (e.g., at input record handlers 1160 and/or at feature processors 1162) before the forecasting algorithms/models are applied. In such embodiments, demand forecasting may be performed on the pre-processed data set rather than on the raw data records.

In their programmatic interactions with the MLS via interfaces 1161, clients 1164 may indicate a number of preferences or requirements which may be taken into account when implementing the forecasting algorithms in various embodiments. Some clients 1164 may simply indicate a source of the time series data and leave the analysis and reporting decisions to the MLS; other clients, who are more conversant with the statistics involved or who are experts in the subject matter or domain of the observed data, may provide more detailed guidance or preferences with regard to the forecasting decisions.

The administrative or control plane portion of the MLS may include a request handler 1180, which accepts client requests 1111, and takes different actions depending on the nature of the analysis requested. For at least some types of requests, the request handler may insert corresponding job objects into batch job queue 1142, as indicated by arrow 1112. In general, the control plane of the MLS may comprise a plurality of components (including the request handler, the forecasting coordinator, a real-time analytics manager, workload distribution strategy selectors, one or more job schedulers, metrics collectors, and modules that act as interfaces with other services), which may also be referred to collectively as the MLS manager. The data plane of the MLS may include, for example, at least a subset of the servers of pool(s) 1185, storage devices that are used to store input data, intermediate results or final results (some of which may be part of the MLS artifact repository), and the network pathways used for transferring client input data and results.

A given batch job object may indicate one or more operations that are to be performed as a result of the invocation of a programmatic interface 1161, and the scheduling of a given job may in some cases depend upon the successful completion of at least a subset of the operations of an earlier-generated job. In one embodiment, a client may request that forecasting be performed on a set of observation records (which were originally generated at a streaming data source) in batch mode (e.g., instead of in real time, or in addition to being performed in real time). In such a scenario, as indicated by arrow 1132, some or all of the stream data may be stored at a batched data repository. Each batch-mode analysis may be represented by a corresponding job object in the depicted embodiment. For at least some forecasting requests, the original input data may already be available in batch format.

In at least some implementations, job queue 1142 may be managed as a first-in-first-out (FIFO) queue, with the further constraint that the dependency requirements of a given job must have been met in order for that job to be removed from the queue. In some embodiments, jobs created on behalf of several different clients may be placed in a single queue, while in other embodiments multiple queues may be maintained (e.g., one queue in each data center of the provider network being used, or one queue per MLS customer). Asynchronously with respect to the submission of the requests 1111, the next job whose dependency requirements have been met may be removed from job queue 1142 in the depicted embodiment, as indicated by arrow 1113, and a processing plan comprising a workload distribution strategy may be identified for it. The workload distribution strategy layer 1175, which may also be a component of the MLS control plane as mentioned earlier, may determine the manner in which the lower level operations of the job are to be distributed among one or more compute servers (e.g., servers selected from pool 1185), and/or the manner in which the data analyzed or manipulated for the job is to be distributed among one or more storage devices or servers. As indicated by arrow 1114, the workload distribution strategy layer 1175 may also be utilized by forecasting coordinator 1181 in some embodiments, e.g., to help identify the set of servers to be used for the forecasting. For example, in at least one embodiment the training phase of the RNN model may be implemented using one set of servers, while predictions made by the trained model may be performed using a different set of servers. Prediction runs of the RNN model may take relatively little time in some embodiments compared to the training phase, and as such multiple prediction runs may be performed (for different targeted item sets, or for the same item set) in parallel in some embodiments. After the processing plan has been generated and the appropriate set of resources to be utilized for the batch job has been identified, operations may be scheduled on the identified resources. Results of some batch jobs or real-time analyses may be stored as MLS artifacts within repository 1120 in some embodiments, as indicated by arrow 1147.

In the embodiment shown in FIG. 11, clients 1164 may be able to view at least a subset of the artifacts stored in repository 1120, e.g., by issuing read requests 1118. Results 1195 of some analyses (such as probabilistic demand forecasts of the kind discussed earlier) may be made available to clients 1164 from server pools 1185 via interfaces 1161 in some embodiments. Entries may be added to the knowledge base 1117 based on input received from clients in the depicted embodiment, and knowledge base entries may also be viewed by the clients in at least some embodiments, as also indicated by arrow 1117. Algorithm/model libraries 1163 may include a wide variety of machine learning, statistics and data analysis algorithms in addition to the forecasting algorithms discussed above. In at least one embodiment, the MLS may be designed to be extensible—e.g., clients may provide or register their own modules (which may be defined as user-defined functions) for input record handling, feature processing, or for implementing additional machine learning algorithms than are supported natively by the MLS.

It is noted that at least in some embodiments, a machine learning service infrastructure similar to that shown in FIG. 11 may be set up for internal use within a particular organization or business entity. For example, the customers (represented by clients 1164 in FIG. 11) of the forecaster and other components of the MLS may be part of the same business entity which implements the MLS. An Internet-based retailer may utilize such a private machine learning service infrastructure for managing its inventories in some embodiments.

Use Cases

The techniques described above, of utilizing RNN-based models to generate probabilistic forecasts for demand for various kinds of items may be extremely useful in a number of scenarios. The inventories of many retailers, including Internet-based retailers, may often include large numbers of relatively infrequently-sold items such as shoes, luggage, clothing, various luxury items, and the like, as well as some items that sell much more frequently. The time required to replenish supplies of various items may vary—some orders for the items may be fulfilled within a few days, while others may take weeks or months. The forecasting methodology described may be able to predict item-specific demands over various future periods with high confidence levels in a timely manner, without requiring excessive amounts of compute power. Using RNNs trained using large historical demand data sets, demand predictions for inventories which may include millions of items may be generated in a scalable manner. Once the RNN-based model is trained, the time taken to generate forecasts for selected items or groups of items may be quite short, making it easy to answer a variety of questions regarding hypothetical situations such as "What is the likely impact on sales of reducing the price of item X by Y % in time period T?". The forecasts produced may be used as input to a number of automated systems, including but not limited to order management systems, discount/promotion planning systems, facilities planning systems, or product placement planning systems for physical (e.g., walk-in) retail locations.

Illustrative Computer System

Figure 12:
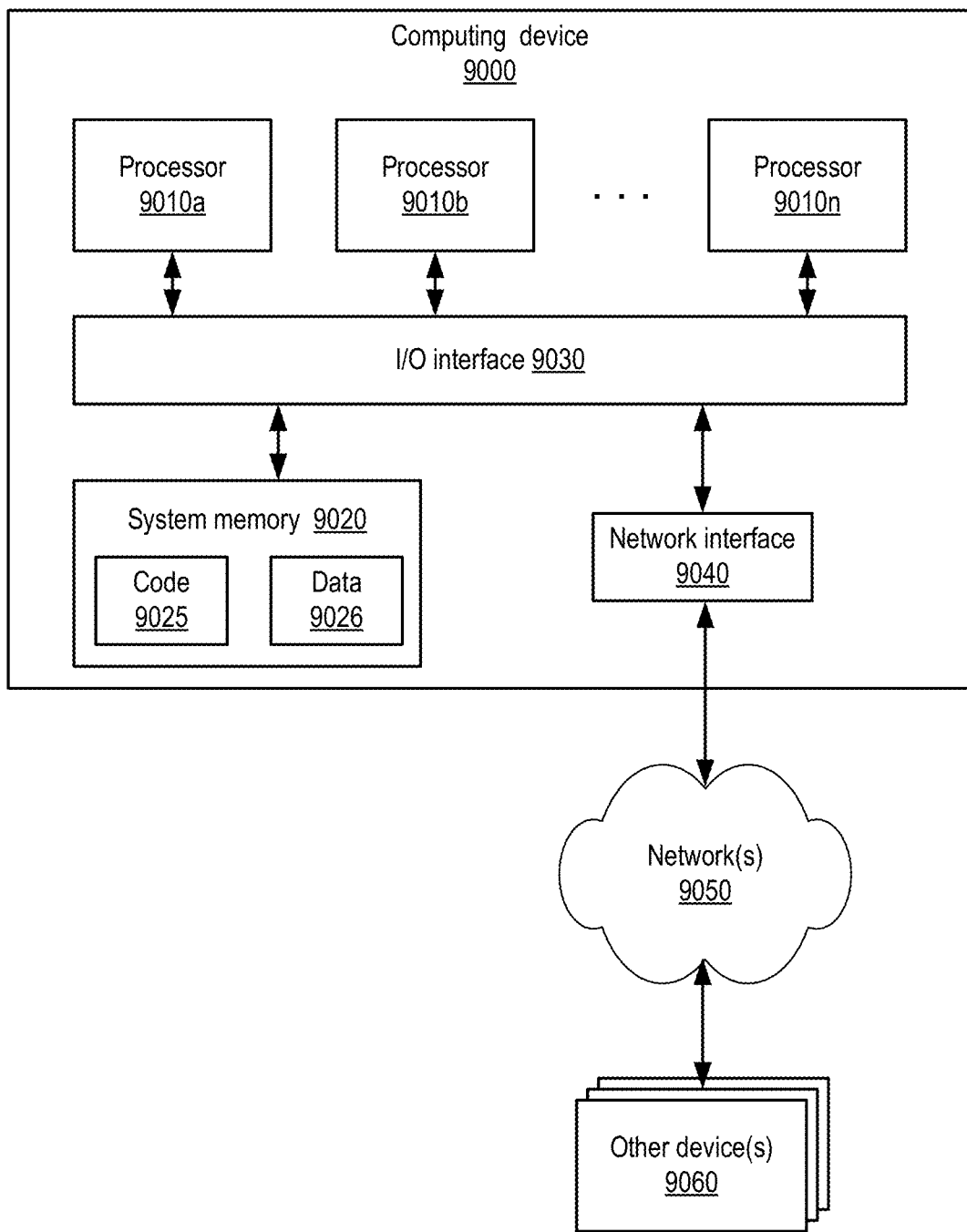
FIG. 12 is a block diagram illustrating an example computing device that may be used in at least some embodiments.

In at least some embodiments, a server that implements a portion or all of one or more of the technologies described herein, including the RNN-based forecasting techniques, as well as various components of a machine learning service may include a general-purpose computer system that includes or is configured to access one or more computer-accessible media. FIG. 12 illustrates such a general-purpose computing device 9000. In the illustrated embodiment, computing device 9000 includes one or more processors 9010 coupled to a system memory 9020 (which may comprise both non-volatile and volatile memory modules) via an input/output (I/O) interface 9030. Computing device 9000 further includes a network interface 9040 coupled to I/O interface 9030.

In various embodiments, computing device 9000 may be a uniprocessor system including one processor 9010, or a multiprocessor system including several processors 9010 (e.g., two, four, eight, or another suitable number). Processors 9010 may be any suitable processors capable of executing instructions. For example, in various embodiments, processors 9010 may be general-purpose or embedded processors implementing any of a variety of instruction set architectures (ISAs), such as the x86, PowerPC, SPARC, or MIPS ISAs, or any other suitable ISA. In multiprocessor systems, each of processors 9010 may commonly, but not necessarily, implement the same ISA. In some implementations, graphics processing units (GPUs) may be used instead of, or in addition to, conventional processors.

System memory 9020 may be configured to store instructions and data accessible by processor(s) 9010. In at least some embodiments, the system memory 9020 may comprise both volatile and non-volatile portions; in other embodiments, only volatile memory may be used. In various embodiments, the volatile portion of system memory 9020 may be implemented using any suitable memory technology, such as static random access memory (SRAM), synchronous dynamic RAM or any other type of memory. For the non-volatile portion of system memory (which may comprise one or more NVDIMMs, for example), in some embodiments flash-based memory devices, including NAND-flash devices, may be used. In at least some embodiments, the non-volatile portion of the system memory may include a power source, such as a supercapacitor or other power storage device (e.g., a battery). In various embodiments, memristor based resistive random access memory (ReRAM), three-dimensional NAND technologies, Ferroelectric RAM, magnetoresistive RAM (MRAIVI), or any of various types of phase change memory (PCM) may be used at least for the non-volatile portion of system memory. In the illustrated embodiment, program instructions and data implementing one or more desired functions, such as those methods, techniques, and data described above, are shown stored within system memory 9020 as code 9025 and data 9026.

In one embodiment, I/O interface 9030 may be configured to coordinate I/O traffic between processor 9010, system memory 9020, and any peripheral devices in the device, including network interface 9040 or other peripheral interfaces such as various types of persistent and/or volatile storage devices. In some embodiments, I/O interface 9030 may perform any necessary protocol, timing or other data transformations to convert data signals from one component (e.g., system memory 9020) into a format suitable for use by another component (e.g., processor 9010). In some embodiments, I/O interface 9030 may include support for devices attached through various types of peripheral buses, such as a variant of the Peripheral Component Interconnect (PCI) bus standard or the Universal Serial Bus (USB) standard, for example. In some embodiments, the function of I/O interface 9030 may be split into two or more separate components, such as a north bridge and a south bridge, for example. Also, in some embodiments some or all of the functionality of I/O interface 9030, such as an interface to system memory 9020, may be incorporated directly into processor 9010.

Network interface 9040 may be configured to allow data to be exchanged between computing device 9000 and other devices 9060 attached to a network or networks 9050, such as other computer systems or devices as illustrated in FIG. 1 through FIG. 11, for example. In various embodiments, network interface 9040 may support communication via any suitable wired or wireless general data networks, such as types of Ethernet network, for example. Additionally, network interface 9040 may support communication via telecommunications/telephony networks such as analog voice networks or digital fiber communications networks, via storage area networks such as Fibre Channel SANs, or via any other suitable type of network and/or protocol.

In some embodiments, system memory 9020 may be one embodiment of a computer-accessible medium configured to store program instructions and data as described above for FIG. 1 through FIG. 11 for implementing embodiments of the corresponding methods and apparatus. However, in other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computing device 9000 via I/O interface 9030. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computing device 9000 as system memory 9020 or another type of memory. Further, a computer-accessible medium may include transmission media or signals such as electrical, electromagnetic, or digital signals, conveyed via a communication medium such as a network and/or a wireless link, such as may be implemented via network interface 9040. Portions or all of multiple computing devices such as that illustrated in FIG. 12 may be used to implement the described functionality in various embodiments; for example, software components running on a variety of different devices and servers may collaborate to provide the functionality. In some embodiments, portions of the described functionality may be implemented using storage devices, network devices, or special-purpose computer systems, in addition to or instead of being implemented using general-purpose computer systems. The term "computing device", as used herein, refers to at least all these types of devices, and is not limited to these types of devices.

CONCLUSION

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent exemplary embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended to embrace all such modifications and changes and, accordingly, the above description to be regarded in an illustrative rather than a restrictive sense.

What is claimed is:

1. A system, comprising:
one or more computing devices of a recurrent neural-network based artificial intelligence service for time series predictions;
wherein the one or more computing devices are configured to:
obtain an indication of a first data set comprising a respective time series of demand observations for a plurality of items;
train a recurrent neural network model using a plurality of time series of the first data set, wherein the recurrent neural network is trained to make probabilistic demand forecasts for a plurality of different items, and wherein training of the recurrent neural network model comprises performing a compensation operation to the plurality of times series of the first data set to compensate for differences between respective distributions of the demand observations for different items within the first data set;
receive indications of different target items for which respective probabilistic demand forecasts are to be generated, wherein the first data set does not include a time series comprising demand observations of at least one of the target items;
obtain respective probabilistic demand forecasts for the different target items using a plurality of executions of the same recurrent neural network model, wherein the respective probabilistic demand forecasts comprise respective aggregations of individual demand forecasts indicated by respective executions of the plurality of executions; and
provide, via a programmatic interface, respective representations of the probabilistic demand forecasts.

2. The system as recited in claim 1, wherein to obtain the probabilistic demand forecasts, the one or more computing devices are configured to:
predict, using the recurrent neural network model, one or more parameters of a first demand distribution corresponding to a first time step; and
utilize a sample from the first demand distribution as input of the model, wherein a second set of nodes of the model is used to predict parameters of a second demand distribution corresponding to a second time step.

3. The system as recited in claim 1, wherein the compensation operation comprises:
generating one or more sub-sequences of a time series of the first data set; and
utilizing the one or more sub-sequences as respective training examples.

4. The system as recited in claim 1, wherein the compensation operation comprises:
assigning a first weight to a first time series of the first data set during training of the recurrent neural network model; and
assigning a second weight to a second time series of the first data set during training of the recurrent neural network model.

5. The system as recited in claim 1, wherein the compensation operation comprises applying a scaling function to at least one of: (a) an input of the recurrent neural network model for a particular time series, or (b) an output of the recurrent neural network model for the particular time series.

6. A method, comprising:
performing, by one or more computing devices:
obtaining an indication of a first data set comprising a respective time series of demand observations for a plurality of items;
training a recurrent neural network model to generate demand forecasts for a plurality of different items, wherein training of the recurrent neural network model is based at least in part on (a) analysis of a plurality of time series of the first data set and (b) performing one or more compensation operations to the plurality of times series of the first data set to compensate for statistical differences between respective distributions of the demand observations for different items within the first data set, wherein, within the training data set of the recurrent neural network model, a count of demand observations of at least one other item exceeds a count of demand observations of a target item;
generating respective probabilistic demand forecasts for different target items using one or more executions of the same recurrent neural network model; and
providing, via a programmatic interface, respective representations of the probabilistic demand forecasts.

7. The method as recited in claim 6, wherein generating the probabilistic demand forecasts comprises:
predicting, using the recurrent neural network model, one or more parameters of a first demand distribution corresponding to a first time step; and
utilizing a sample from the first demand distribution as input to predict parameters of a second demand distribution corresponding to a second time step.

8. The method as recited in claim 6, wherein a particular compensation operation comprises excluding a sample of the first data set from the training data set.

9. The method as recited in claim 6, wherein a particular compensation operation of the one or more compensation operations comprises:
assigning a first weight to a first time series of the first data set during training of the recurrent neural network model; and
assigning a second weight to a second time series of the first data set during training of the recurrent neural network model.

10. The method as recited in claim 6, wherein a particular compensation operation of the one or more compensation operations comprises:
applying a normalization function to at least one of: (a) an input of the recurrent neural network model, or (b) an output of the recurrent neural network model.

11. The method as recited in claim 6, further comprising performing, by the one or more computing devices:

utilizing, as input for at least one execution of the one or more executions of the recurrent neural network model, an indication of a similarity between at least one of the target items and a second item, wherein, within the training data set, a count of demand observations of the second item exceeds the count of demand observations of the at least one target item.

12. The method as recited in claim 11, wherein the indication of a similarity comprises one or more of: (a) a price, (b) a product category, (c) item introduction timing information, or (d) marketing information.

13. The method as recited in claim 6, further comprising performing, by the one or more computing devices:

utilizing, as input for at least one execution of the one or more executions of the recurrent neural network model, a time series of demand of at least one of the target items.

14. The method as recited in claim 6, further comprising performing, by the one or more computing devices:

selecting a first sub-sequence of elements of a first time series as a first training example for the recurrent neural network model; and selecting a second sub-sequence of elements of the first time series as a second training example for the recurrent neural network model, wherein the first sub-sequence differs from the second sub-sequence in one or more of: (a) a starting offset within the first time series or (b) a number of elements.

15. The method as recited in claim 6, wherein training the neural network model comprises utilizing a probabilistic sampling technique to determine whether input for a particular time step is to include (a) a sample from a demand distribution predicted by the recurrent neural network model for a previous time step or (b) a demand observation corresponding to the previous time step, wherein according to the probabilistic sampling technique, the probability of utilizing the sample increases as the total number of training iterations increases.

16. A non-transitory computer-accessible storage medium storing program instructions that when executed on one or more processors cause the one or more processors to:

obtain an indication of a first data set comprising a respective time series of observations for a plurality of items;

train a recurrent neural network model to generate forecasts for at least some different items of the plurality of items, wherein training of the recurrent neural network model is based at least in part on (a) analysis of a plurality of time series of the first data set and (b) performing one or more compensation operations to the plurality of times series of the first data set to compensate for differences between respective distributions of the demand observations for different items within the first data set, wherein, within the training data set of the recurrent neural network model, a count of observations of at least one other item exceeds a count of observations of a target item;

generate respective probabilistic demand forecasts for different target items using one or more executions of the same recurrent neural network model; and provide, via a programmatic interface, respective representations of the probabilistic demand forecasts.

17. The non-transitory computer-accessible storage medium as recited in claim 16, wherein to generate the probabilistic forecasts, the program instructions when executed on one or more processors cause the one or more processors to:

predict, using the recurrent neural network model, one or more parameters of a first output distribution corresponding to a first time step; and utilize a sample from the first output distribution as input to predict parameters of a second output distribution corresponding to a second time step.

18. The non-transitory computer-accessible storage medium as recited in claim 16, wherein to train the recurrent neural network model, the program instructions when executed on one or more processors cause the one or more processors to:

identify statistical differences among a plurality of time series of the first data set; and perform one or more compensation operations based on the statistical differences.

19. The non-transitory computer-accessible storage medium as recited in claim 16, wherein to train the recurrent neural network model, the program instructions when executed on one or more processors cause the one or more processors to:

identify a first product category to which a first item of the plurality of items belongs, and a second product category to which a second item of the plurality of items belongs; and perform one or more compensation operations based on a difference between the number of items belonging to the first category and the number of items belonging to the second category.

20. The non-transitory computer-accessible storage medium as recited in claim 16, wherein a first time series of the plurality of time series includes a first group of demand observations for a first item corresponding to a first year, and a second group of demand observations for the first item corresponding to a second year, wherein a particular holiday correlated with changes in demand for the first item occurs on a particular date in the first year, wherein the particular holiday occurs on a different date in the second year, wherein the program instructions when executed on one or more processors cause the one or more processors to:

include, within input for at least one execution of the one or more executions of the recurrent neural network model, an indication of a future date on which the particular holiday is to occur, wherein a demand predicted for at least one of the target items by the recurrent neural network model is based at least in part on the future date.

21. The non-transitory computer-accessible storage medium as recited in claim 16, wherein individual ones of the time series of the first data set represent demand observations for a respective item of the plurality of items, wherein the probabilistic demand forecast for at least one of the target items comprises a particular probabilistic demand forecast, wherein the program instructions when executed on one or more processors cause the one or more processors to:

transmit a representation of the particular probabilistic demand forecast to one or more of: (a) an automated ordering system, wherein the automated ordering system is configured to generate one or more orders for one or more items based at least in part on the particular probabilistic demand forecast, (b) a discount planning system, (c) a facilities planning system, (d) a promotions planning system, or (e) a product placement planning system for a physical store.

22. The non-transitory computer-accessible storage medium as recited in claim 16, wherein to generate the probabilistic demand forecasts, the program instructions when executed on one or more processors cause the one or more processors to:
  predict one or more parameters of at least one of: (a) a negative binomial distribution corresponding to an integer-valued time series or (b) a Gaussian distribution corresponding to a real-valued time series.

23. The non-transitory computer-accessible storage medium as recited in claim 16, wherein to generate the probabilistic demand forecasts, the program instructions when executed on one or more processors cause the one or more processors to:
  utilize an approximate method to estimate at least a probability distribution of demand.

24. The non-transitory computer-accessible storage medium as recited in claim 23, wherein the approximate method comprises a use of a generative adversarial network.

* * * * *